United States Patent
Liu et al.

(10) Patent No.: US 12,324,208 B2
(45) Date of Patent: *Jun. 3, 2025

(54) METHOD FOR MANUFACTURING SEMICONDUCTOR DEVICE INCLUDING ANNEALING TREATMENT OF INNER SPACER LAYER

(71) Applicant: Taiwan Semiconductor Manufacturing Co., Ltd., Hsinchu (TW)

(72) Inventors: Yoh-Rong Liu, Taipei (TW); Wen-Kai Lin, Yilan County (TW); Che-Hao Chang, Hsinchu (TW); Chi On Chui, Hsinchu (TW); Yung-Cheng Lu, Hsinchu (TW); Li-Chi Yu, Jhubei (TW); Sen-Hong Syue, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/425,058

(22) Filed: Jan. 29, 2024

(65) Prior Publication Data
US 2024/0194765 A1 Jun. 13, 2024

Related U.S. Application Data

(63) Continuation of application No. 18/149,224, filed on Jan. 3, 2023, now Pat. No. 11,923,432, which is a
(Continued)

(51) Int. Cl.
H10D 64/01 (2025.01)
H10D 30/67 (2025.01)
(Continued)

(52) U.S. Cl.
CPC ....... H10D 64/018 (2025.01); H10D 30/6735 (2025.01); H10D 30/6757 (2025.01);
(Continued)

(58) Field of Classification Search
CPC ..... H01L 21/823412; H01L 21/823431; H01L 21/823468; H01L 21/823807;
(Continued)

(56) References Cited

U.S. PATENT DOCUMENTS 9,209,247 B2  12/2015  Colinge et al.
9,236,267 B2  1/2016  De et al.
(Continued)

*Primary Examiner* — Cheung Lee
(74) *Attorney, Agent, or Firm* — Slater Matsil, LLP

(57) ABSTRACT

A method of manufacturing a semiconductor device includes forming a multi-layer stack of alternating first layers of a first semiconductor material and second layers of a second semiconductor material on a semiconductor substrate, forming a first recess through the multi-layer stack, and laterally recessing sidewalls of the second layers of the multi-layer stack. The sidewalls are adjacent to the first recess. The method further includes forming inner spacers with respective seams adjacent to the recessed second layers of the multi-layer stack and performing an anneal treatment on the inner spacers to close the respective seams.

20 Claims, 49 Drawing Sheets

Related U.S. Application Data continuation of application No. 17/230,224, filed on Apr. 14, 2021, now Pat. No. 11,545,559.

(51) Int. Cl.
 *H10D 84/01* (2025.01)
 *H10D 84/03* (2025.01)

(52) U.S. Cl.
 CPC ......... *H10D 64/015* (2025.01); *H10D 64/017* (2025.01); *H10D 84/0128* (2025.01); *H10D 84/0147* (2025.01); *H10D 84/0158* (2025.01); *H10D 84/038* (2025.01)

(58) Field of Classification Search
 CPC ..... H01L 21/823821; H01L 21/823864; H01L 27/0924; H01L 29/0673; H01L 29/165; H01L 29/20; H01L 29/42392; H01L 29/66439; H01L 29/66469; H01L 29/6653; H01L 29/66545; H01L 29/66553; H01L 29/775; H01L 29/7848; H01L 29/78696; H01L 219/42392; B82Y 10/00; H10D 64/018; H10D 84/01; H10D 84/0147; H10D 84/0158; H10D 84/038
 See application file for complete search history.

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2019/0165135 A1 | 5/2019 | Cheng et al. | |
| 2020/0044060 A1 | 2/2020 | Cheng et al. | |
| 2020/0185539 A1 | 6/2020 | Lee et al. | |
| 2021/0083091 A1* | 3/2021 | Peng | H01L 29/785 |
| 2021/0098634 A1 | 4/2021 | Chung et al. | |

* cited by examiner

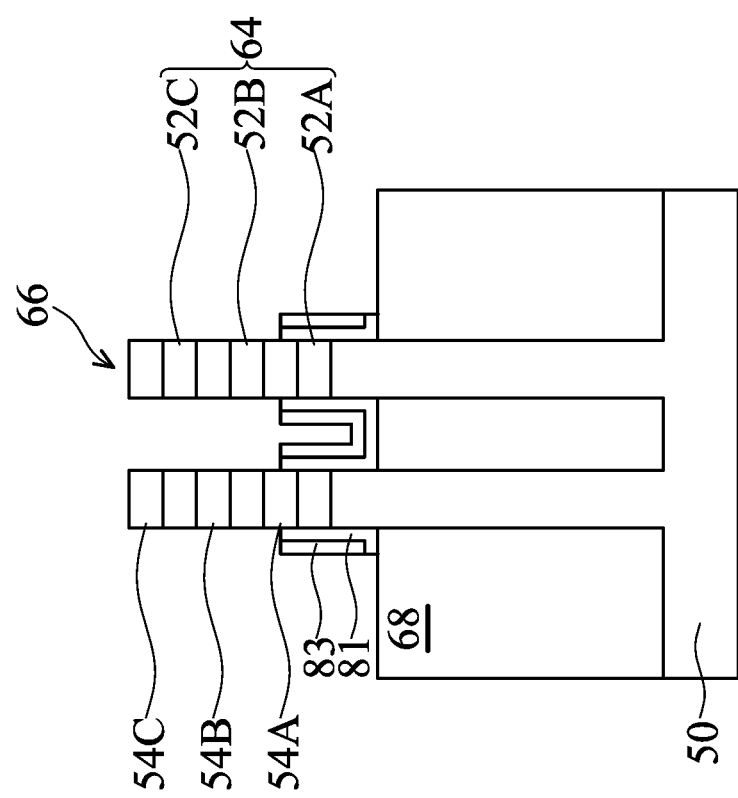

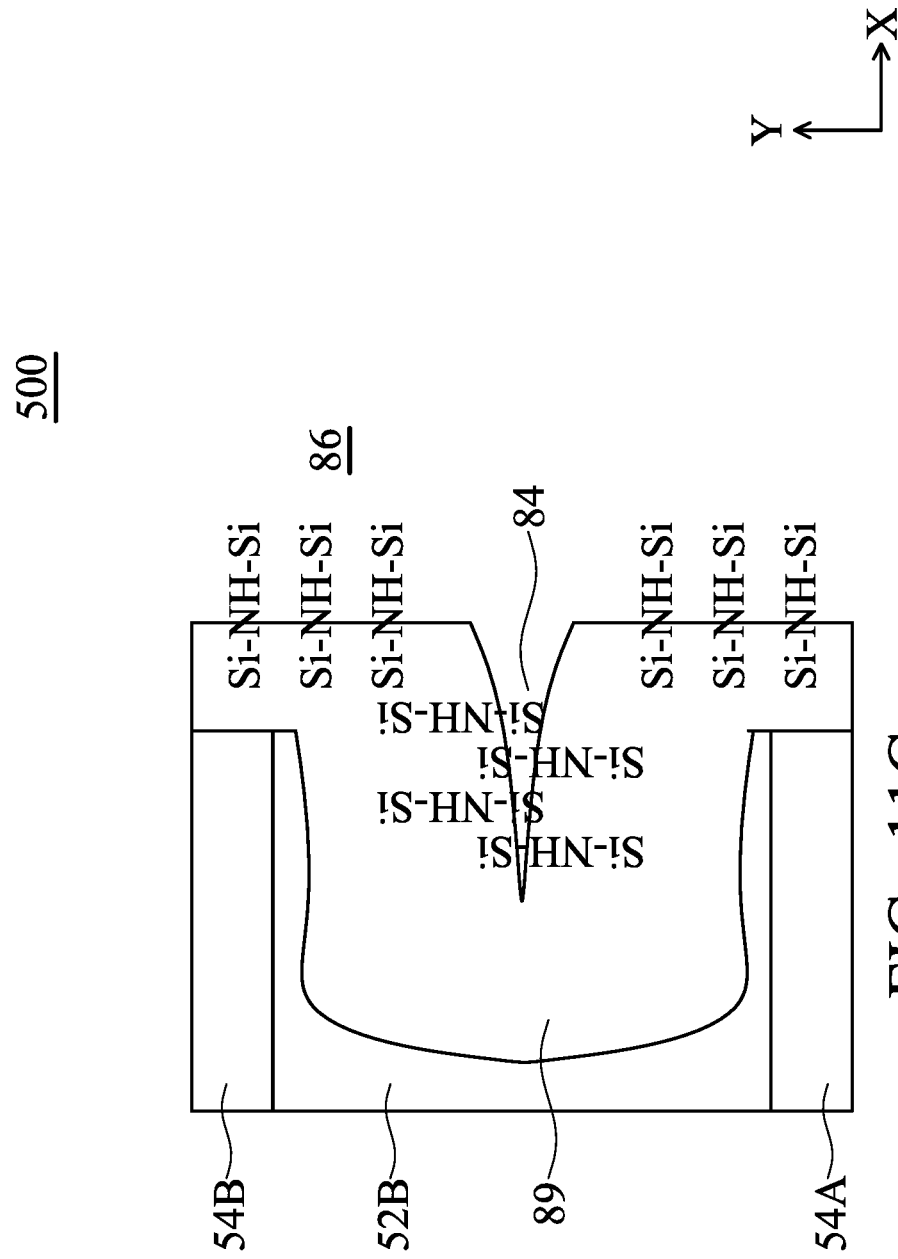

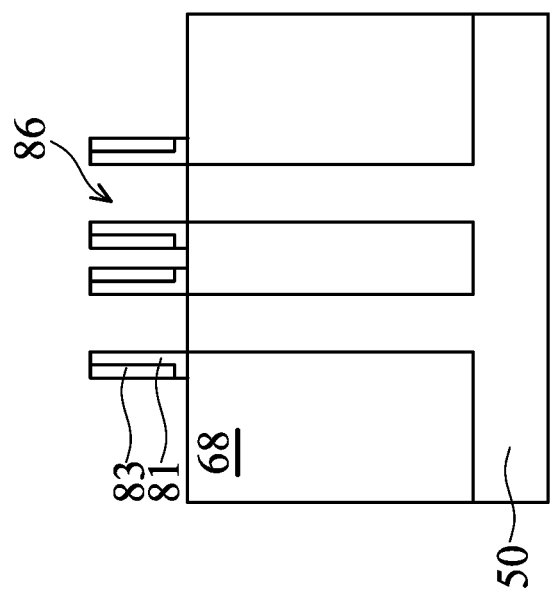

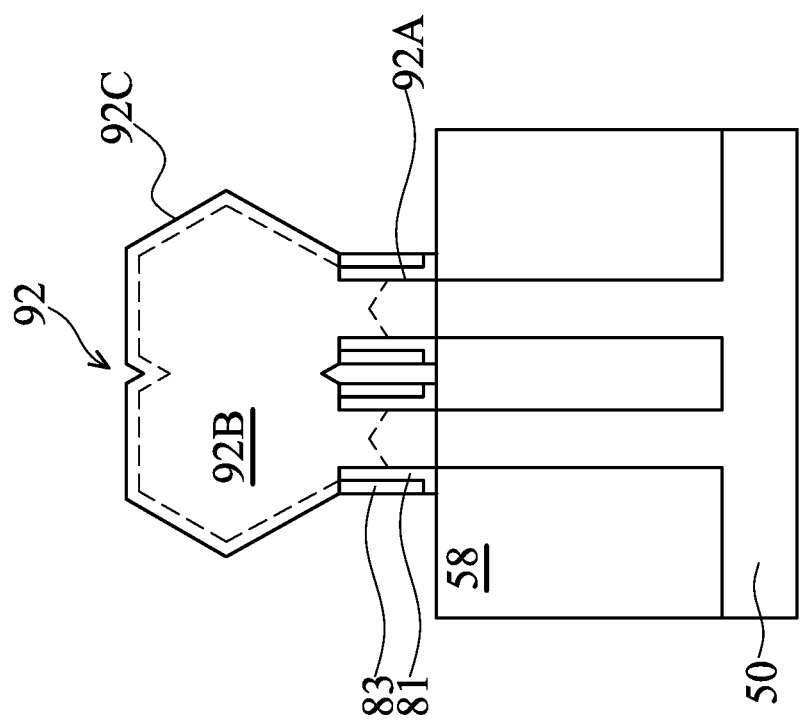

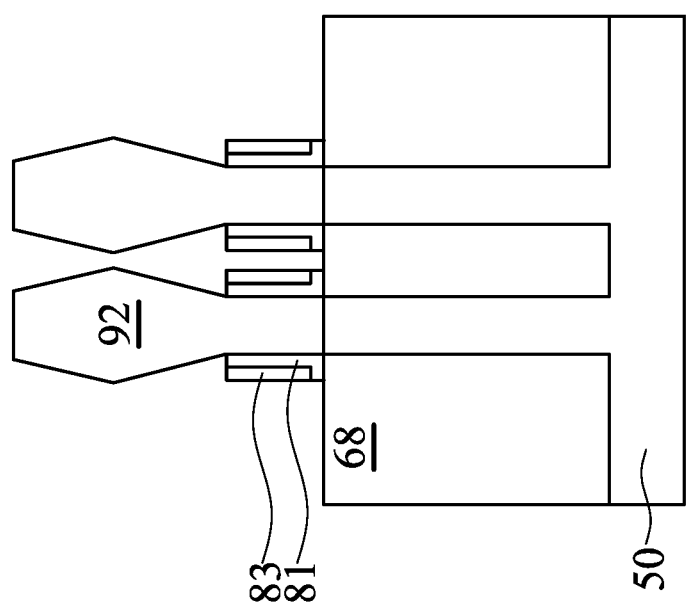

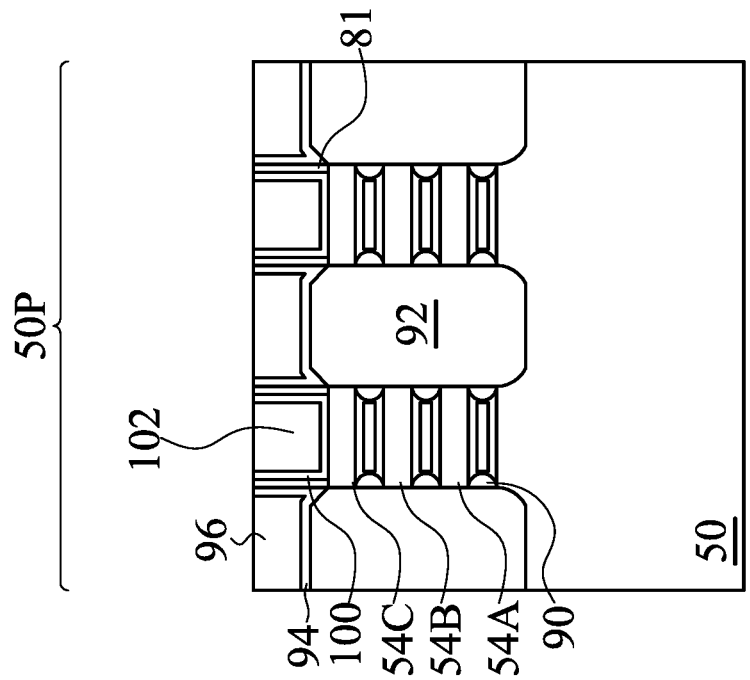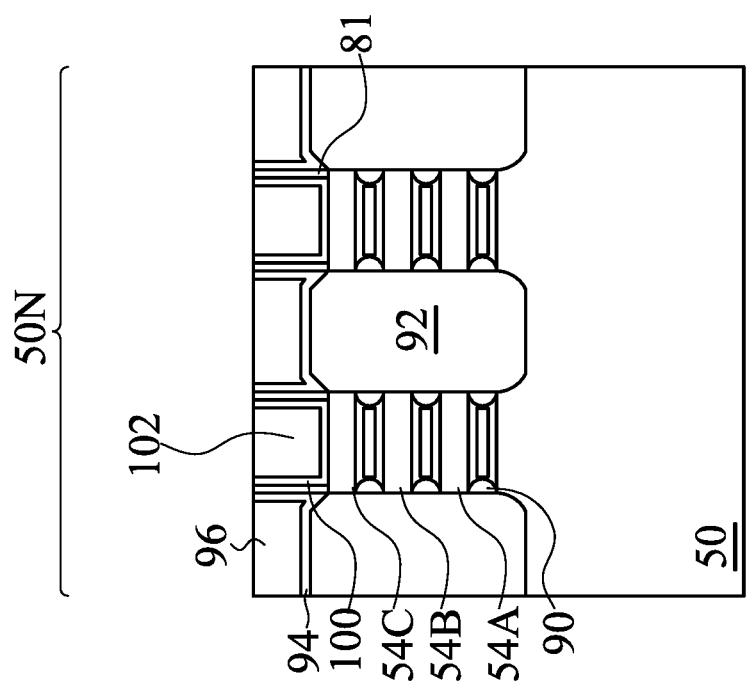
FIG. 20B

METHOD FOR MANUFACTURING SEMICONDUCTOR DEVICE INCLUDING ANNEALING TREATMENT OF INNER SPACER LAYER

PRIORITY CLAIM AND CROSS-REFERENCE

This application is a continuation of U.S. patent application Ser. No. 18/149,224, filed on Jan. 3, 2023, and entitled, "Semiconductor Device and Method," which is a continuation of U.S. patent application Ser. No. 17/230,224, filed on Apr. 14, 2021, now U.S. Pat. No. 11,545,559 issued Jan. 3, 2023, and entitled, "Semiconductor Device and Method," each application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 7A, 7B, 8A, 8B, 9A, 9B, 10A, 10B, 10C, 11A, 11B, 11C, 12, 13A, 13B, 14A, 14B, 14C, 15A, 15B, 15C, 15D, 16A, 16B, 16C, 17A, 17B, 18A, 18B, 19A, 19B, 20A, 20B, 21A, 21B, 21C, 22A, 22B, 22C, 23A, 23B, and 23C are cross-sectional views of intermediate stages in the manufacturing of nano-FETs, in accordance with some embodiments.

DETAILED DESCRIPTION

Figure 1:
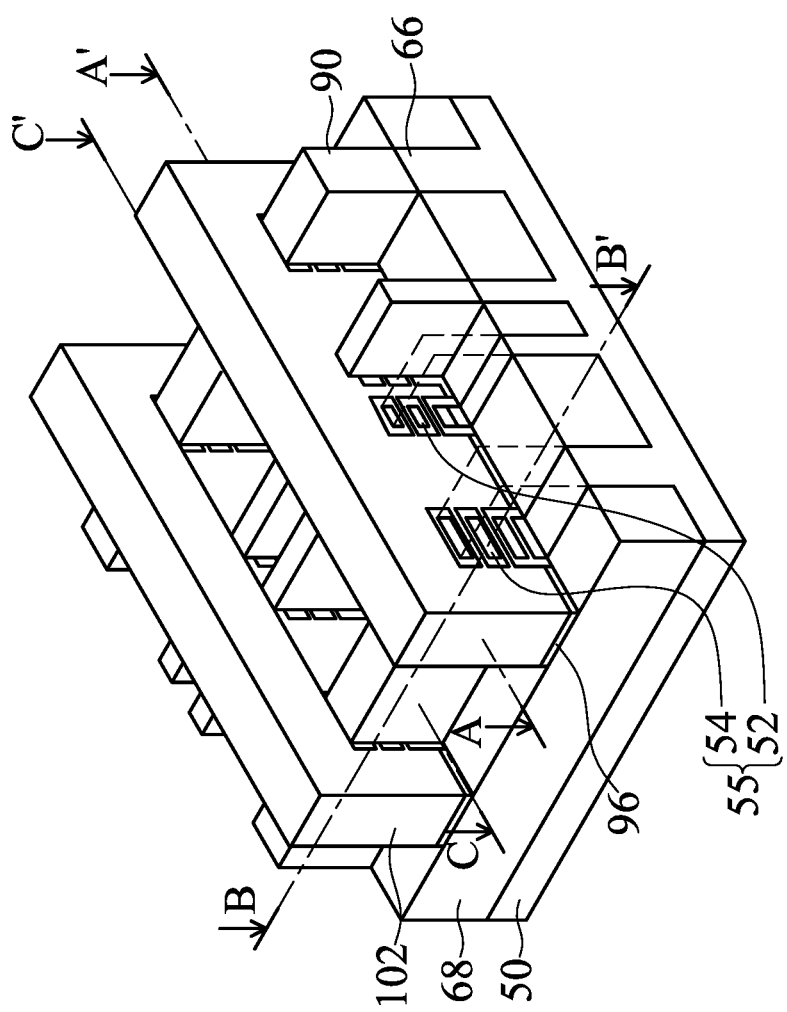
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments such as those discussed herein may provide reduced seams in inner spacers for nano-FETs. An anneal treatment, such as a furnace thermal process with a wet steam anneal and a dry $N_2$ anneal, may improve the dishing profile and narrow the seams of the inner spacers. The anneal treatment may form a hydrophobic surface by encouraging Si—O—Si bonding which may be helpful for wet etching resistance to retain thickness of the inner spacers. The dielectric constant k of the inner spacer material may be favorably reduced. The reduction of the seams may be useful for device integration by reducing weak points for subsequent etching and for preventing electrical shorts on the seams. This may lead to a reduction in the effective gate capacitance ($C_{eff}$) of the nano-FET device, which may increase the AC performance of the device.

FIG. 1 illustrates an example of nano-FETs (e.g., nanowire, nanosheet, or the like) in a three-dimensional view, in accordance with some embodiments. The nano-FETs comprise p-type nano-structures 52 and n-type nano-structures 54 (collectively referred to as nano-structures 55) over fins 66 on a substrate 50 (e.g., a semiconductor substrate), wherein the nano-structures 55 act as channel regions for the nano-FETs. Isolation regions 68 are disposed between adjacent fins 66, which may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may comprise a single material or a plurality of materials. In this context, the fins 66 refer to the portion extending between the neighboring isolation regions 68.

Gate dielectric layers 96 are over top surfaces of the fins 66 and along top surfaces, sidewalls, and bottom surfaces of the p-type nano-structures 52 and n-type nano-structures 54. Gate electrodes 102 are over the gate dielectric layers 96. Epitaxial source/drain regions 90 are disposed on the fins 66 on opposing sides of the gate dielectric layers 96 and the gate electrodes 102.

FIG. 1 further illustrates reference cross-sections that are used in later figures. Cross-section A-A' is along a longitudinal axis of a gate electrode 98 and in a direction, for example, perpendicular to the direction of current flow between the epitaxial source/drain regions 90 of a nano-FET. Cross-section B-B' is perpendicular to cross-section A-A' and is along a longitudinal axis of a fin 66 in a PMOS region of the nano-FET and in a direction of, for example, a current flow between the epitaxial source/drain regions 90 of the nano-FET. Cross-section C-C' is parallel to cross-section A-A' and extends through epitaxial source/drain regions of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 23C are cross-sectional views of intermediate stages in the manufacturing of nano-FETs, in accordance with some embodiments. FIGS. 2 through 5, 6A, 16A, 17A, 18A, 19A, 20A, 21A, 22A, and 23A illustrate reference cross-section A-A' illustrated in FIG. 1. FIGS. 6B, 7B, 8B, 9B, 10B, 10C, 11B, 11C, 12, 13A, 13B, 14B, 14C, 15B, 15D, 16B, 17B, 18B, 19B, 20B, 21B, 22B, and 23B illustrate reference cross-section B-B' illustrated in FIG. 1. FIGS. 7A, 8A, 9A, 10A, 11A, 14A, 15A, 15C, 16C, 21C, 22C, and 23C illustrate reference cross-section C-C' illustrated in FIG. 1.

Figure 2:
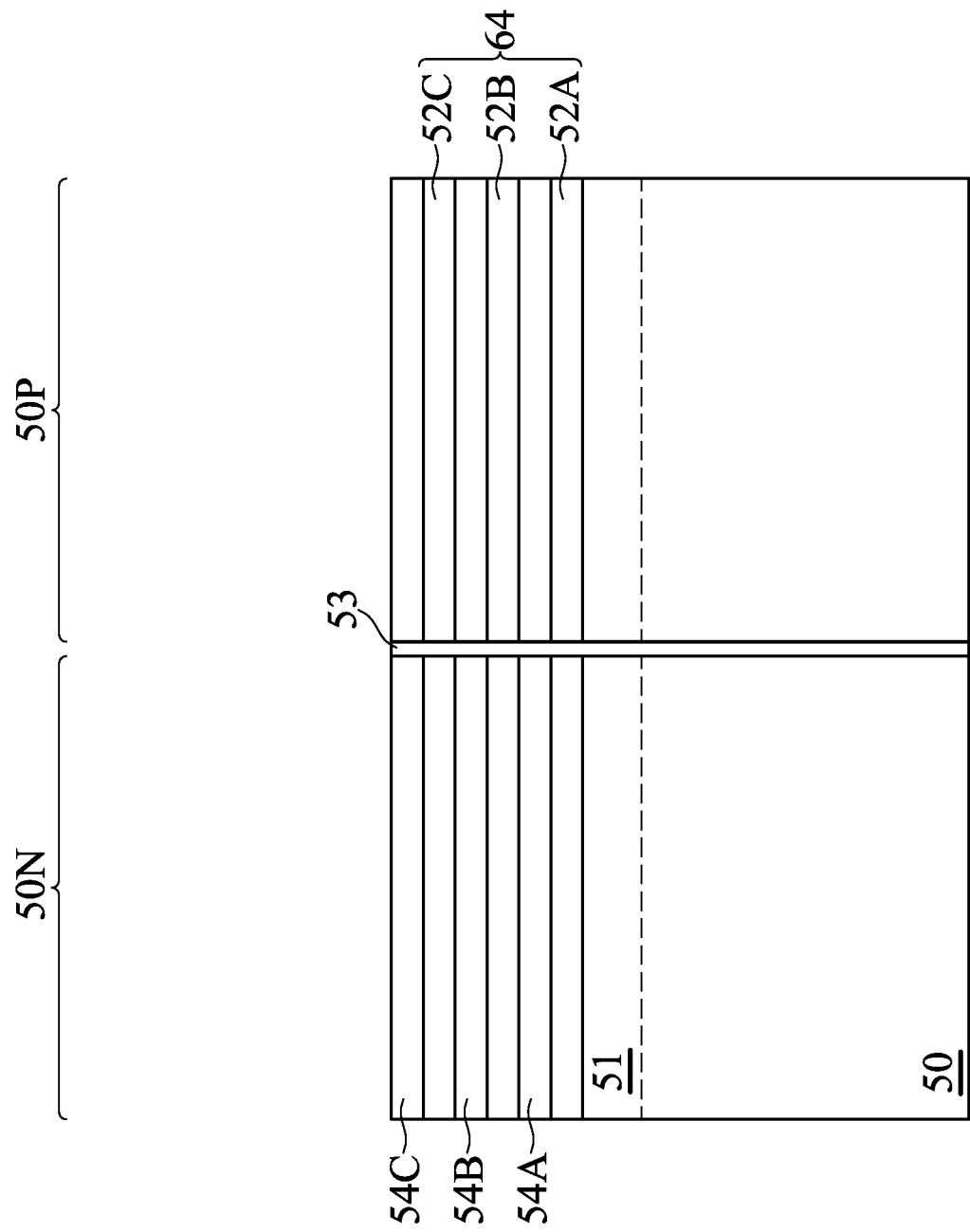

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 53), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

The substrate 50 may be lightly doped with a p-type or an n-type impurity. An anti-punch-through (APT) implantation may be performed on an upper portion of the substrate 50 to form an APT region 51. During the APT implantation, dopants may be implanted in the n-type region 50N and the p-type region 50P. The dopants may have a conductivity type opposite a conductivity type of source/drain regions to be formed in each of the n-type region 50N and the p-type region 50P. The APT region 51 may extend under subsequently formed source/drain regions in the resulting nano-FETs, which will be formed in subsequent processes. The APT region 51 may be used to reduce the leakage from the source/drain regions to the substrate 50. In some embodiments, the doping concentration in APT region 51 may be from about $1 \times 10^{18}$ atoms/cm$^3$ to about $1 \times 10^{19}$ atoms/cm$^3$. For simplicity and legibility, the APT region 51 is not illustrated in subsequent drawings.

Further in FIG. 2, a multi-layer stack 64 is formed over the substrate 50. The multi-layer stack 64 includes alternating layers of first semiconductor layers 52A-C (collectively referred to as first semiconductor layers 52) and second semiconductor layers 54A-C (collectively referred to as second semiconductor layers 54). For purposes of illustration and as discussed in greater detail below, the second semiconductor layers 54 will be removed and the first semiconductor layers 52 will be patterned to form channel regions of nano-FETs in the p-type region 50P, and the first semiconductor layers 52 will be removed and the second semiconductor layers 54 will be patterned to form channel regions of nano-FETs in the n-type regions 50N. Nevertheless, in some embodiments the first semiconductor layers 52 may be removed and the second semiconductor layers 54 may be patterned to form channel regions of nano-FETs in the n-type region 50N, and the second semiconductor layers 54 will be removed and the first semiconductor layers 52 may be patterned to form channel regions of nano-FETs in the p-type regions 50P.

The multi-layer stack 64 is illustrated as including three layers of each of the first semiconductor layers 52 and the second semiconductor layers 54 for illustrative purposes. In some embodiments, the multi-layer stack 64 may include any number of the first semiconductor layers 52 and the second semiconductor layers 54, such as two to four of the first semiconductor layers 52 and the second semiconductor layers 54. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like to a thickness in a range from about 3 nm to about 12 nm. In various embodiments, the first semiconductor layers 52 may be formed of a first semiconductor material suitable for p-type nano-FETs, such as silicon germanium (e.g., $Si_xGe_{1-x}$, where x can be in the range of 0 to 1, such as from 0.2 to 0.35), pure or substantially pure germanium, a III-V compound semiconductor, a II-VI compound semiconductor, or the like, and the second semiconductor layers 54 may be formed of a second semiconductor material suitable for n-type nano-FETs, such as silicon, silicon carbide, a III-V compound semiconductor, a II-VI compound semiconductor, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high-etch selectivity to one another. As such, the first semiconductor layers 52 of the first semiconductor material may be removed without significantly removing the second semiconductor layers 54 of the second semiconductor material in the n-type region 50N, thereby allowing the second semiconductor layers 54 to be patterned to form channel regions of n-type nano-FETS. Similarly, the second semiconductor layers 54 of the second semiconductor material may be removed without significantly removing the first semiconductor layers 52 of the first semiconductor material in the p-type region 50P, thereby allowing the first semiconductor layers 52 to be patterned to form channel regions of p-type nano-FETS.

Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like to a small thickness, such as a thickness in a range of about 5 nm to about 30 nm. In some embodiments, one group of layers (e.g., the second semiconductor layers 54) is formed to be thinner than the other group of layers (e.g., the first semiconductor layers 52). For example, in embodiments where the second semiconductor layers 54 are used to form channel regions and the first semiconductor layers 52 are sacrificial layers (or dummy layers), the first semiconductor layers 52 can be formed to a first thickness T1 and the second semiconductor layers 54 can be formed to a second thickness T2, with the second thickness $T_2$ being from about 30% to about 60% less than the first thickness T1. Forming the second semiconductor layers 54 to a smaller thickness allows the channel regions to be formed at a greater density.

Figure 3:
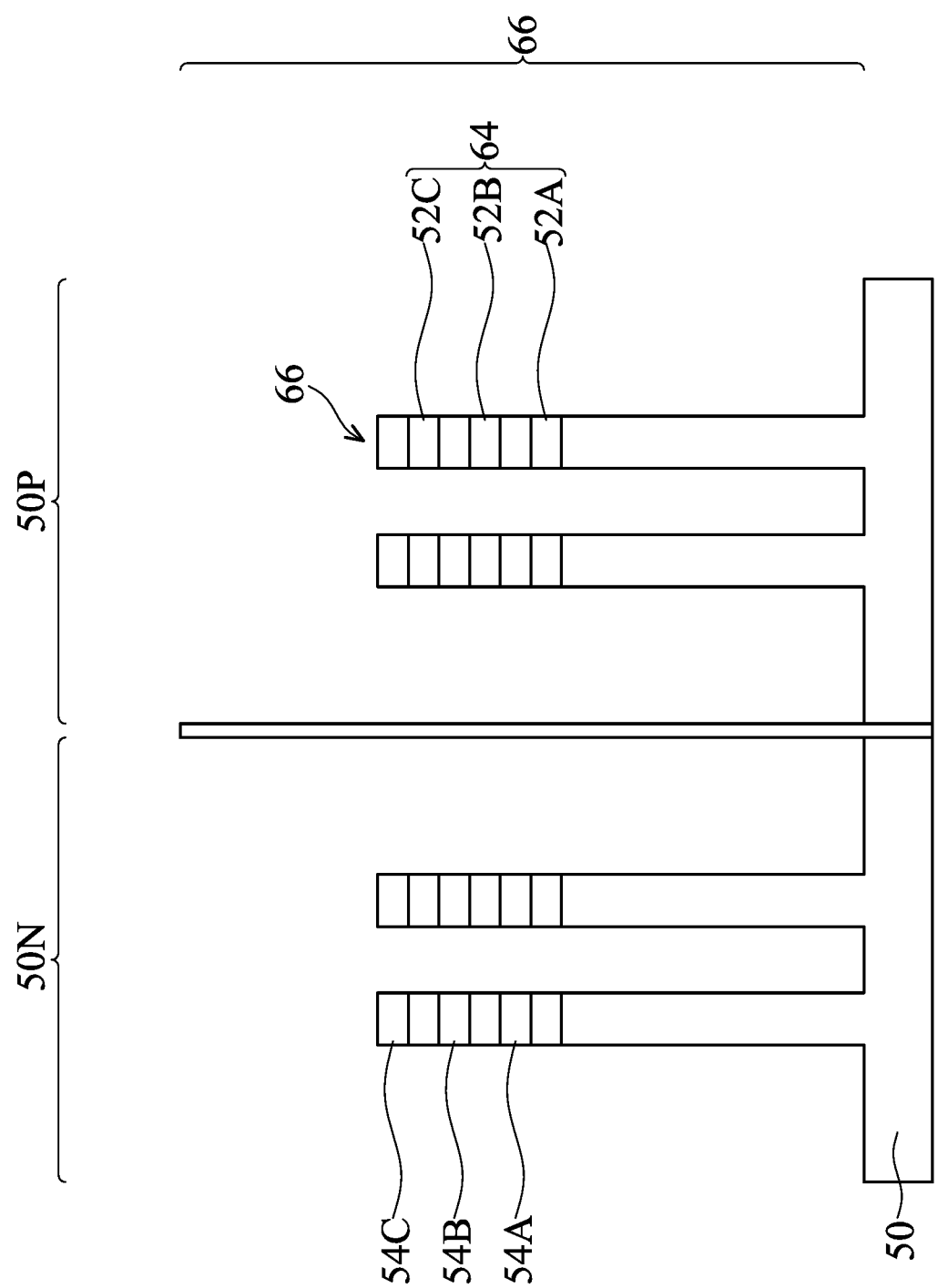

Referring now to FIG. 3, fins 66 are formed in the multi-layer stack 64 and the substrate 50, in accordance with some embodiments. In some embodiments, the fins 66 may be formed in the multi-layer stack 64 and the substrate 50 by etching trenches in the multi-layer stack 64 and the substrate 50. The etching may be any acceptable etch process, such as a reactive ion etch (RIE), neutral beam etch (NBE), the like, or a combination thereof. The etching may be anisotropic.

The fins 66 may be patterned by any suitable method. For example, the fins 66 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial film is formed over a substrate and patterned using a photolithography process. Spacers are formed alongside the patterned sacrificial film using a self-aligned process. The sacrificial film is then removed, and the remaining spacers may then be used to pattern the fins 66.

The fins 66 may have widths in a range from about 5 nm to about 25 nm. FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P.

Figure 4:
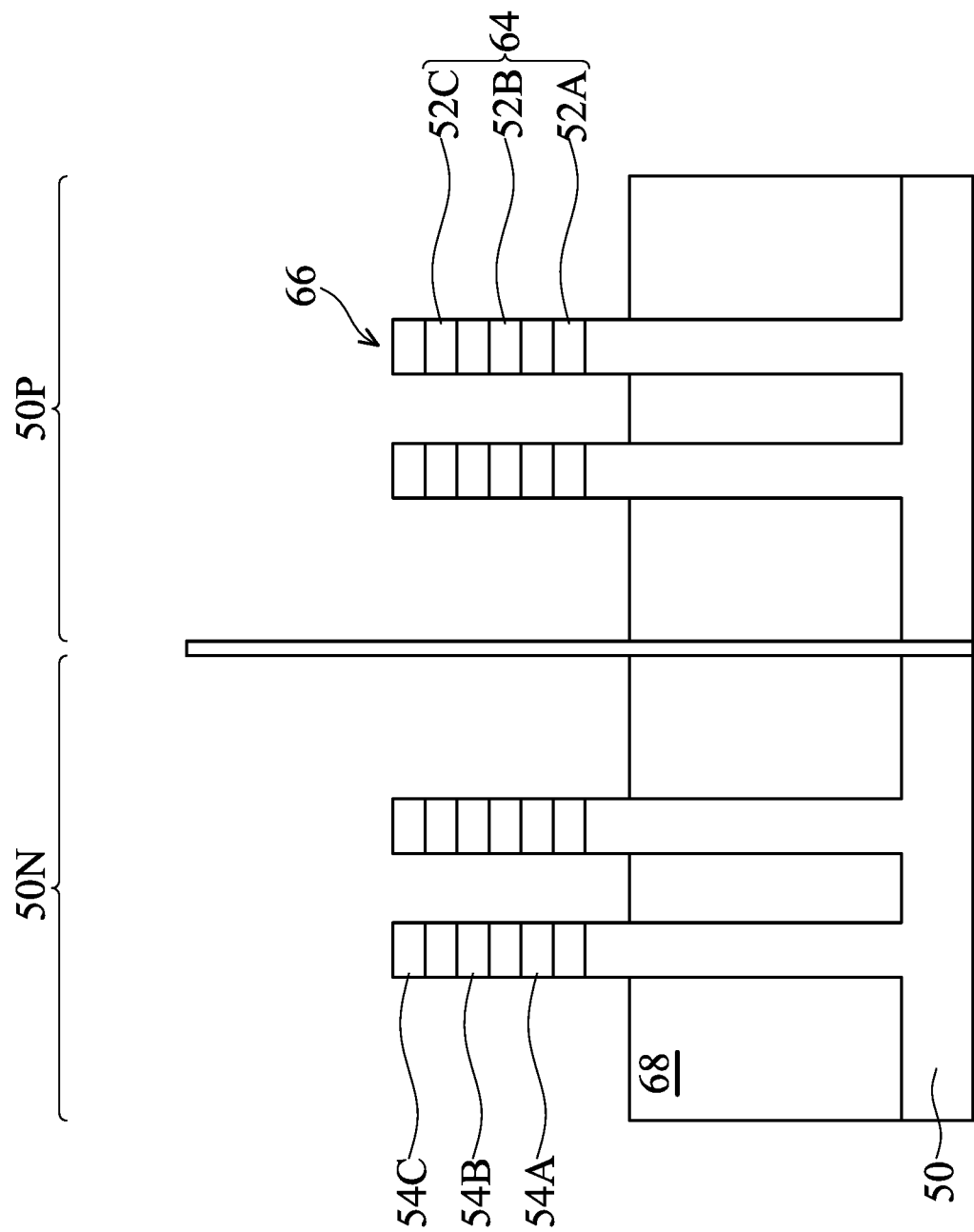

In FIG. 4, shallow trench isolation (STI) regions 68 are formed adjacent the fins 66. The STI regions 68 may be formed by depositing an insulation material over the substrate 50 and the fins 66 and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the fins 66. Although the insulation material is illustrated as a single layer, some embodiments may utilize multiple layers. For example, in some embodiments a liner (not separately illustrated) may first be formed along a surface of the substrate 50 and the fins 66. Thereafter, a fill material, such as those discussed above may be formed over the liner.

A removal process is then applied to the insulation material to remove excess insulation material over the fins 66. In some embodiments, a planarization process such as a chemical mechanical polish (CMP), an etch-back process, combinations thereof, or the like may be utilized. The planarization process exposes the fins 66 such that top surfaces of the fins 66 and the insulation material are level after the planarization process is complete.

The insulation material is then recessed to form the STI regions 68. The insulation material is recessed such that upper portions of fins 66 in the regions 50N and the region 50P protrude from between neighboring STI regions 68. For example, in some embodiments, the insulation material is recessed such that a portion of the substrate underlying a bottommost layer of the first semiconductor layer 52A is exposed. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66). For example, an oxide removal using, for example, dilute hydrofluoric (dHF) acid may be used.

The process described above with respect to FIGS. 2 through 4 is just one example of how the fins 66 may be formed. In some embodiments, the fins 66 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 52 and the second semiconductor layers 54 are illustrated and discussed herein as comprising the same materials in the p-type region 50P and the n-type region 50N for illustrative purposes only. As such, in some embodiments one or both of the first semiconductor layers 52 and the second semiconductor layers 54 may be different materials or formed in a different order in the p-type region 50P and the n-type region 50N.

Further in FIG. 4, appropriate wells (not separately illustrated) may be formed in the fins 66 and/or the substrate 50. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following the implanting of the p-type region 50P, a photoresist or other masks (not separately illustrated) is formed over the fins 66 and the STI regions 68 in the p-type region 50P and the n-type region 50N. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
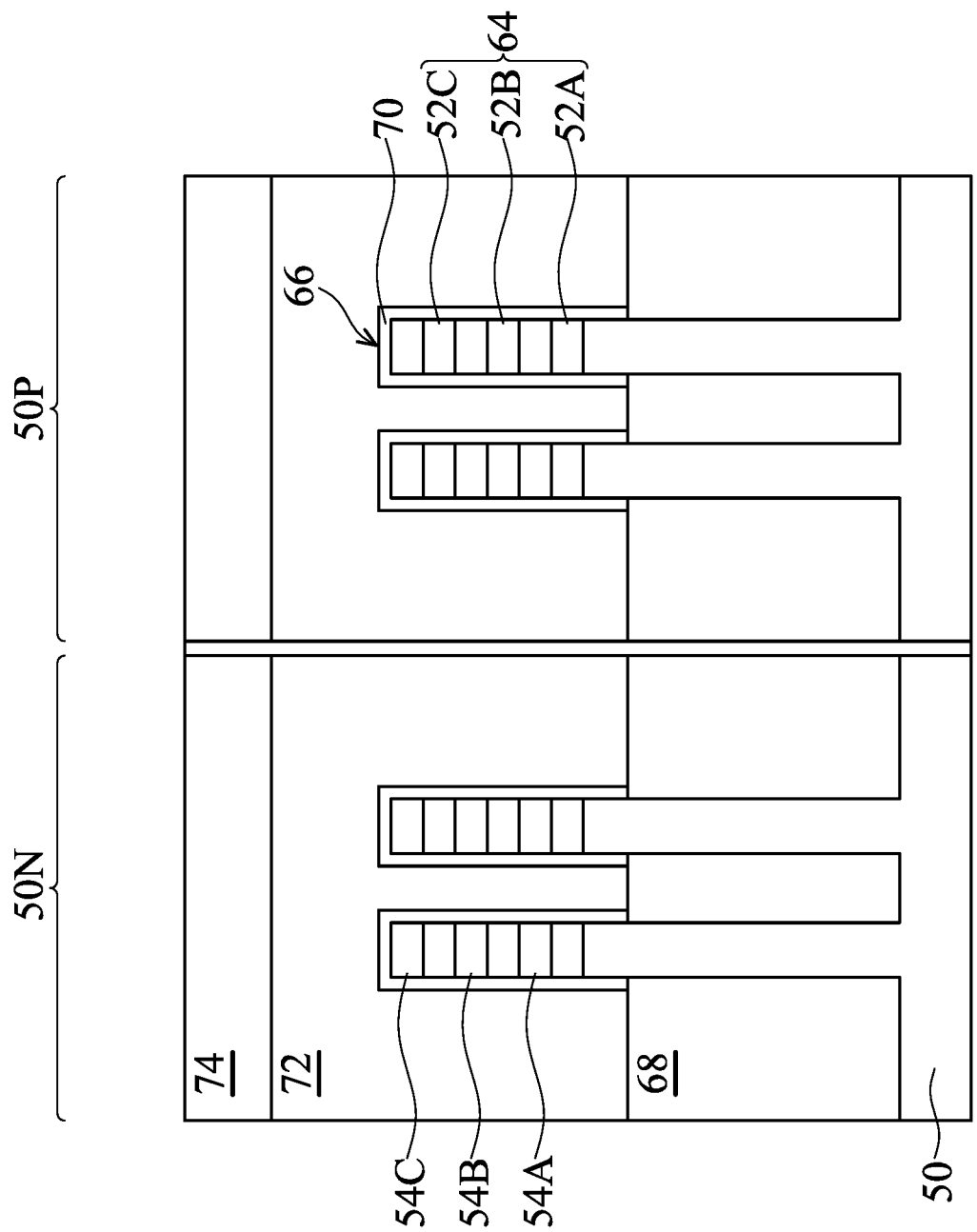

In FIG. 5, a dummy dielectric layer 70 is formed on the fins 66. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 for illustrative purposes only. In some embodiments, the dummy dielectric layer 70 may be deposited such that the dummy dielectric layer 70 covers the STI regions 68, extending between the dummy gate layer 72 and the STI regions 68.

Figure 6A:
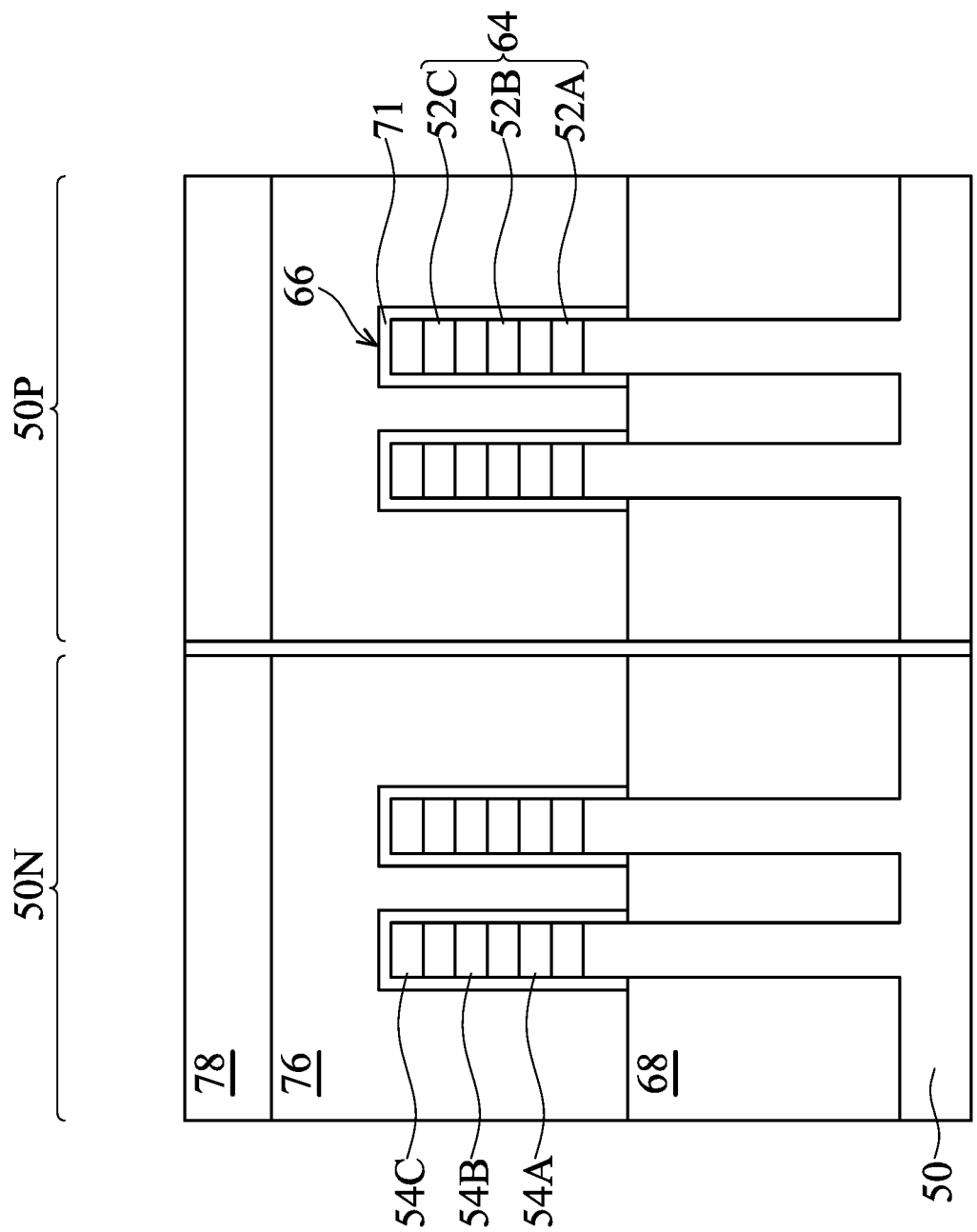
Figure 6B:
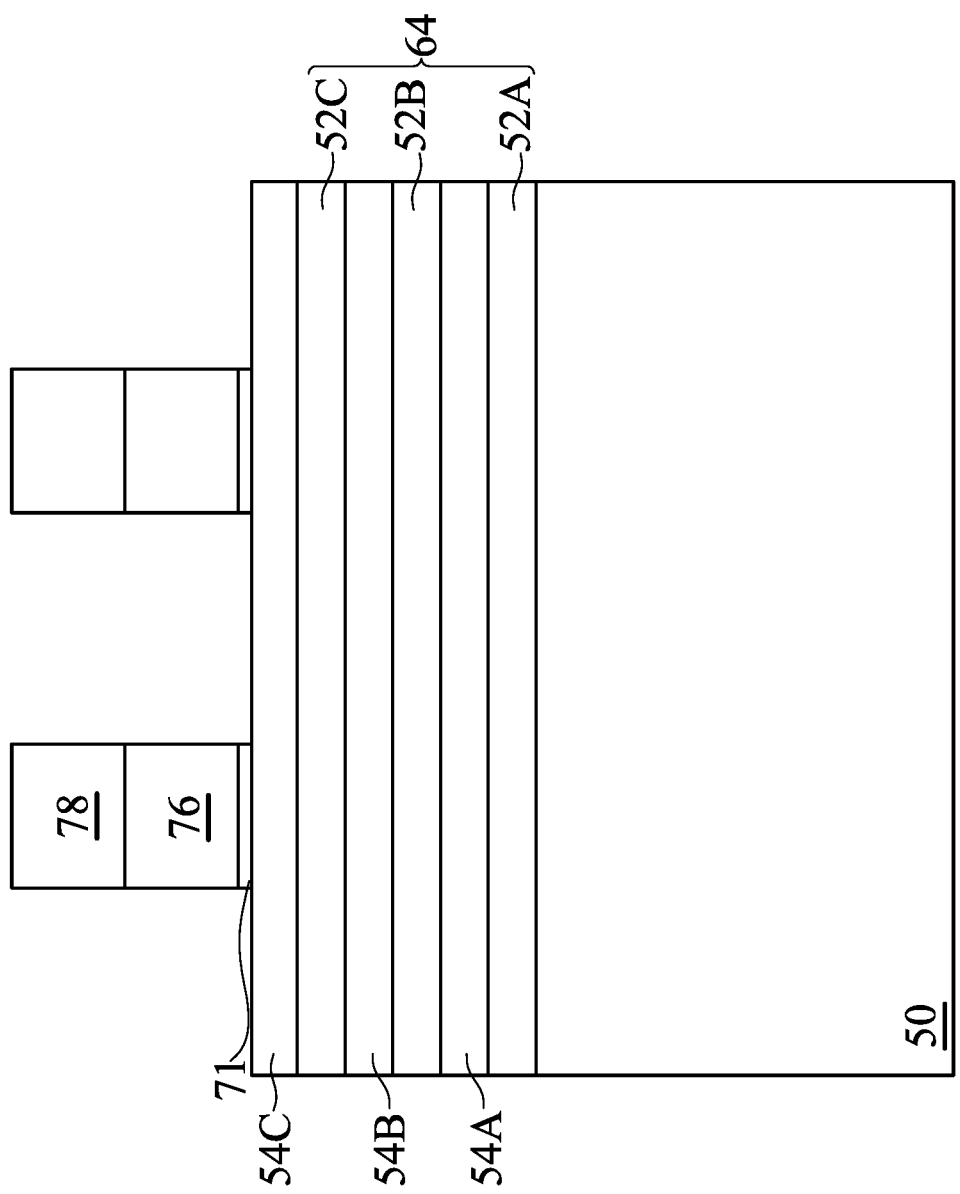

In FIGS. 6A and 6B, the mask layer 74 (see FIG. 5) may be patterned using acceptable photolithography and etching techniques to form masks 78. The pattern of the masks 78 then may be transferred to the dummy gate layer 72 to form dummy gates 76 and to the dummy dielectric layer 70 to form dummy gate dielectrics 71. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66. In some embodiments, the dummy gates 76 have a length in a range of about 14.5 nm to about 17 nm.

Figure 7A:
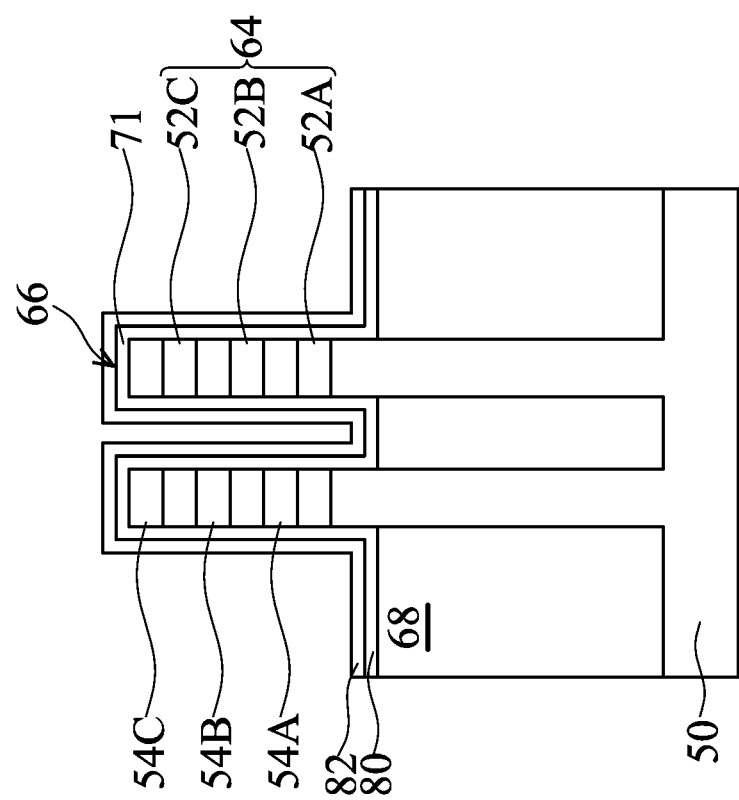
Figure 7B:
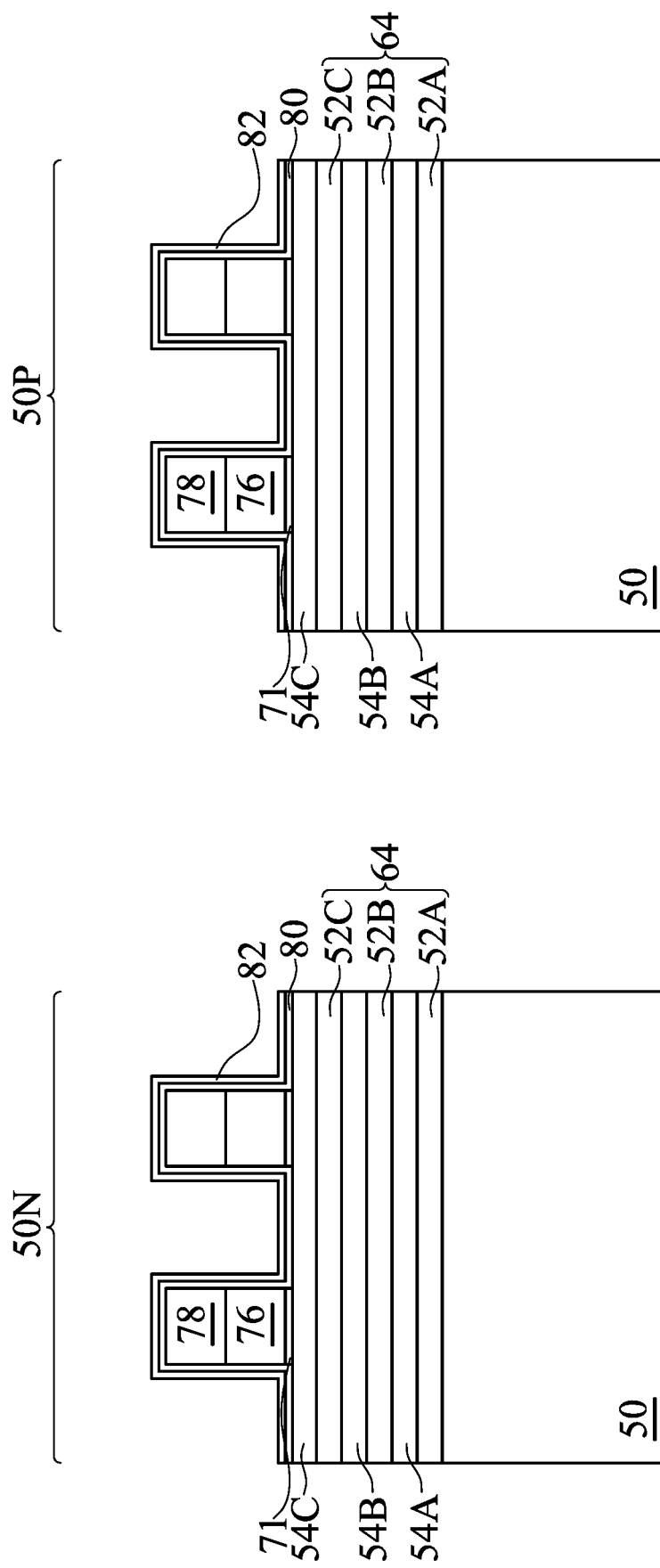

In FIGS. 7A and 7B, a first spacer layer 80 and a second spacer layer 82 are formed over the structures illustrated in FIGS. 6A and 6B, respectively. The first spacer layer 80 and the second spacer layer 82 will be subsequently patterned to act as spacers for forming self-aligned source/drain regions. In FIGS. 7A and 7B, the first spacer layer 80 is formed on top surfaces of the STI regions 68, top surfaces and sidewalls of the nanostructures 66 and the masks 78, and sidewalls of the substrate 50, the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed nanostructures 66 and the substrate 50 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed nanostructures 55 and the substrate 50 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/cm$^3$ to about $1\times10^{19}$ atoms/cm$^3$. An anneal may be used to repair implant damage and to activate the implanted impurities.

Figure 8B:
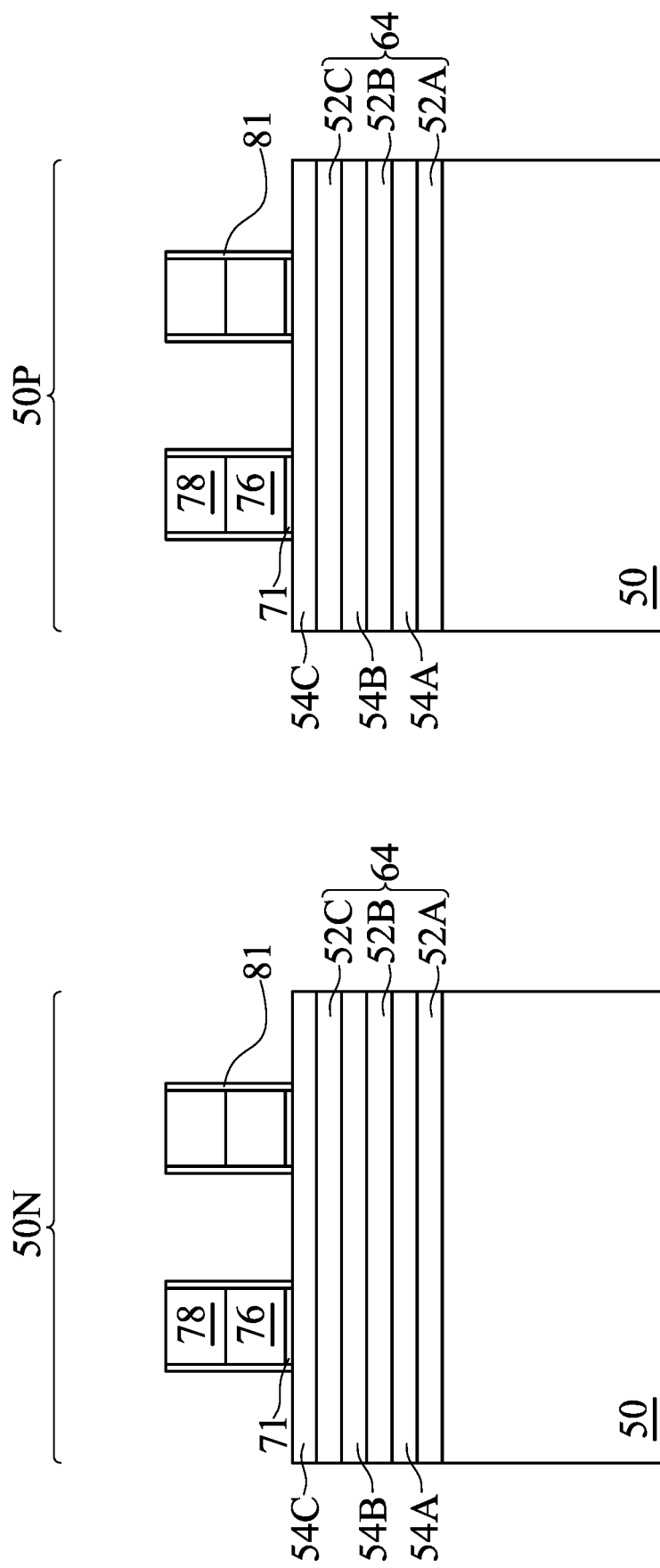

In FIGS. 8A and 8B, the first spacer layer 80 and the second spacer layer 82 are etched to form first spacers 81 and second spacers 83. As will be discussed in greater detail below, the first spacers 81 and the second spacers 83 act to self-aligned subsequently formed source drain regions, as well as to protect sidewalls of the nanostructures 66 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 have different etch rates than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8A. Thereafter, the second spacers 83 acts as a mask while etching exposed portions of the first spacer layer 80, thereby forming first spacers 81 as illustrated in FIG. 8A. In some embodiments, the first spacers 81 have a width in a range of about 3.5 nm to about 5.0 nm. The first spacers 81 may have a k-value in a range of about 4.1 to about 5.5.

As illustrated in FIG. 8A, the first spacers 81 and the second spacers 83 are disposed on sidewalls of the nanostructures 66 and the substrate 50. As illustrated in FIG. 8B, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be formed prior to forming the second spacers 83), additional spacers may be formed and removed, and/or the like. Furthermore, the n-type and p-type devices may be formed using different structures and steps.

Figure 9A:
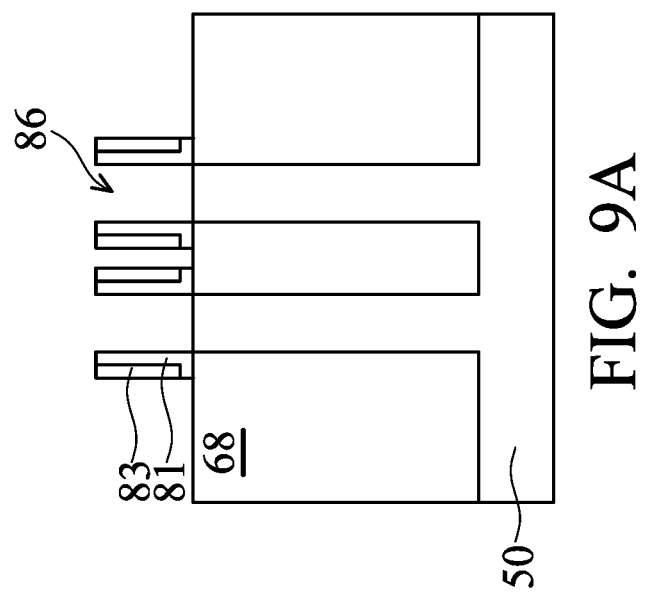
Figure 9B:
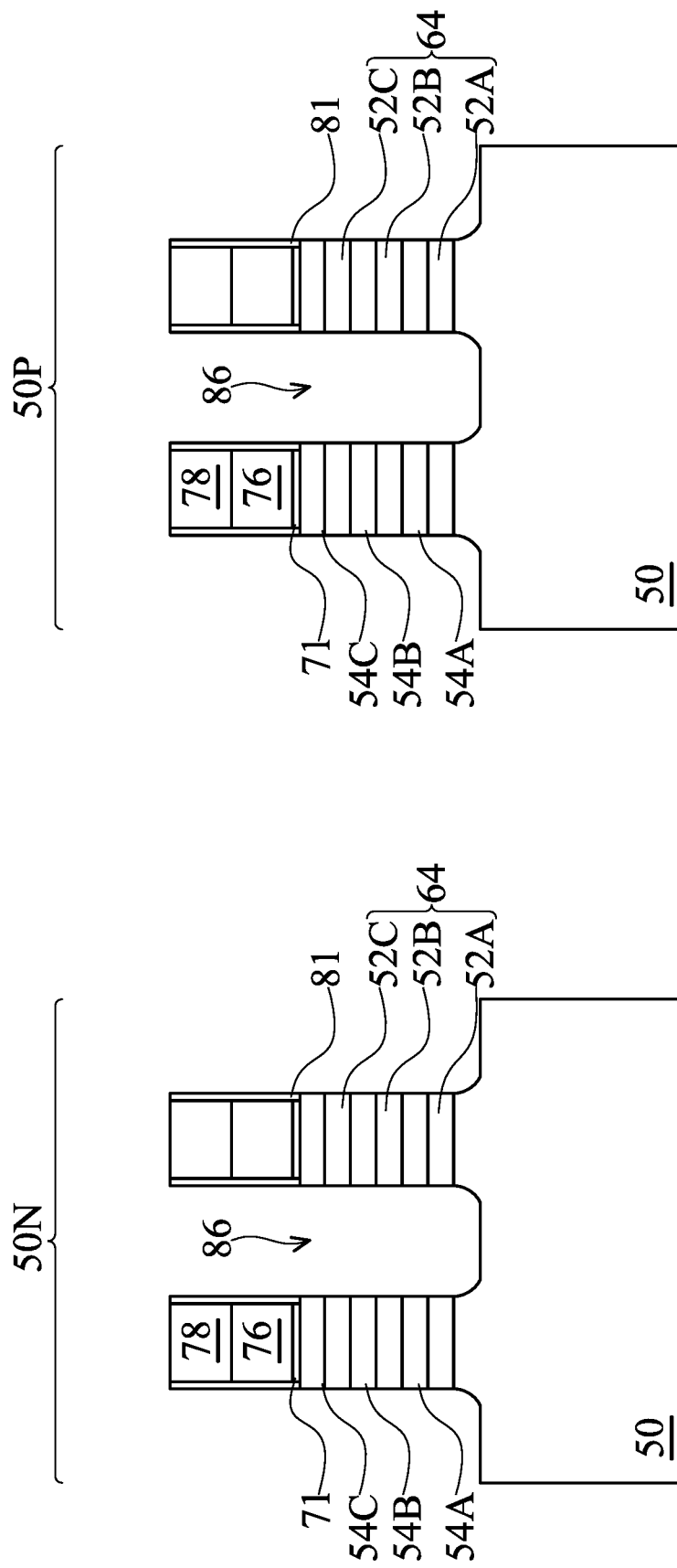

In FIGS. 9A and 9B, first recesses 86 are formed in the nanostructures 66 and the substrate 50, in accordance with some embodiments. Epitaxial source/drain regions will be subsequently formed in the first recesses 86. The first recesses 86 may extend through the first semiconductor layers 52 and the second semiconductor layers 54, and into the substrate 50. As illustrated in FIG. 9A, top surfaces of the STI regions 68 may be level with top surfaces of the substrate 50. In various embodiments, the first recesses 86 may extend to a top surface of the substrate 50 without etching the substrate 50; the substrate 50 may be etched such that bottom surfaces of the first recesses 86 are disposed below the top surfaces of the STI regions 68; or the like. The first recesses 86 may be formed by etching the nanostructures 55 and the substrate 50 using anisotropic etching processes, such as RIE, NBE, or the like. The first spacers 81, the second spacers 83, and the masks 78 mask portions of the nanostructures 66 and the substrate 50 during the etching processes used to form the first recesses 86. A single etch process or multiple etch processes may be used to etch each layer of the nanostructure 66. Timed etch processes may be used to stop the etching of the first recesses 86 after the first recesses 86 reach a desired depth.

Figure 10A:
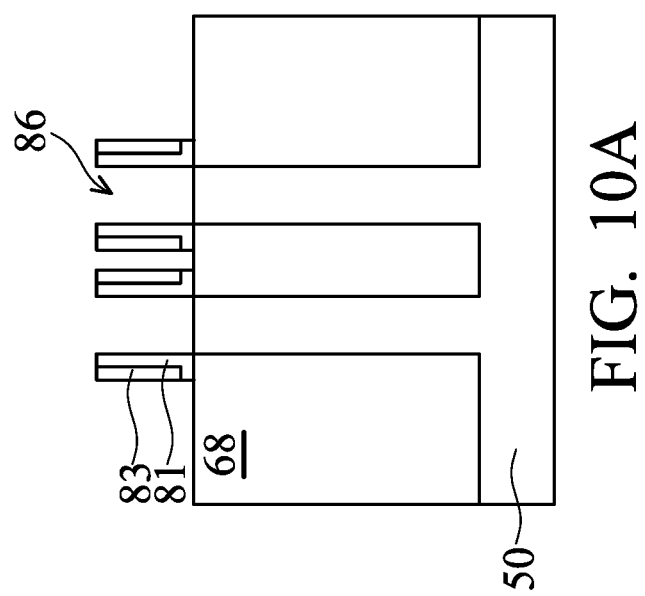
Figure 10B:
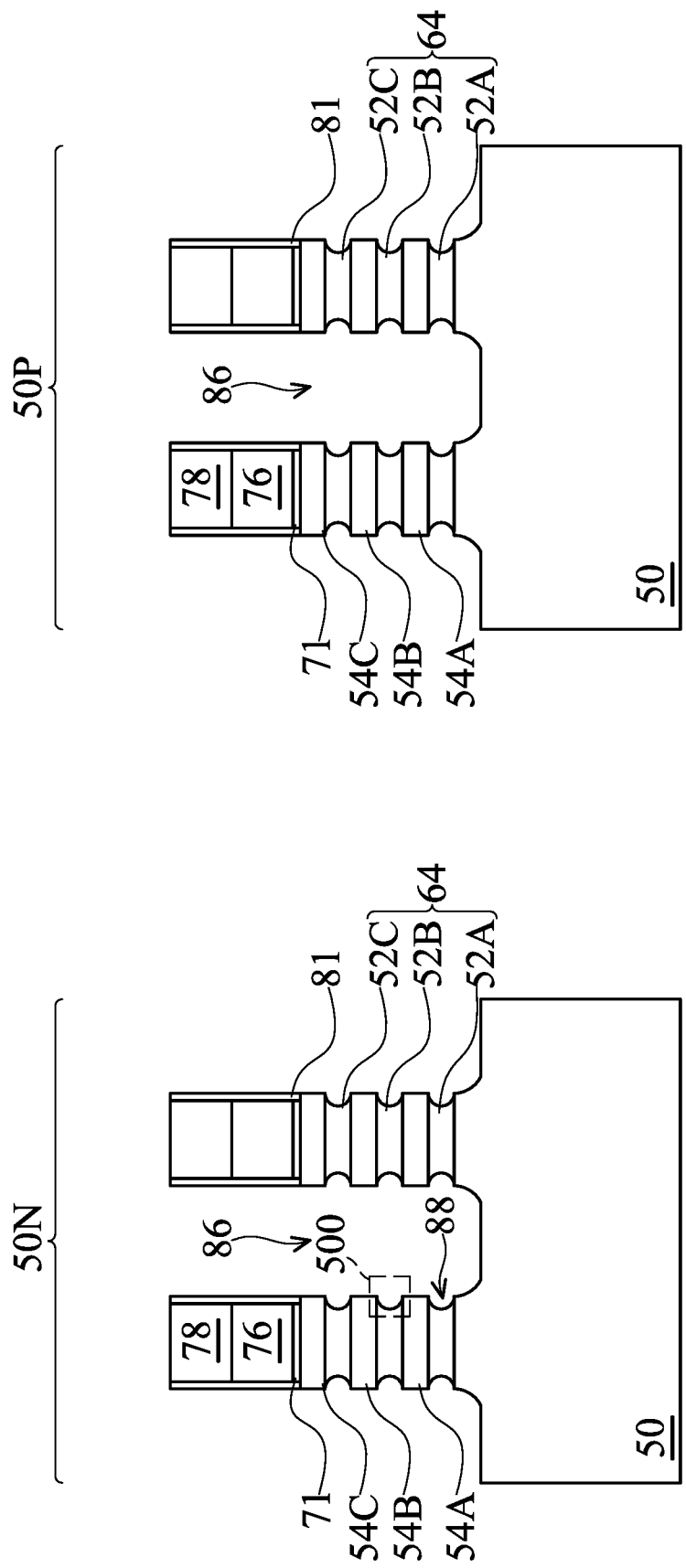
Figure 10C:
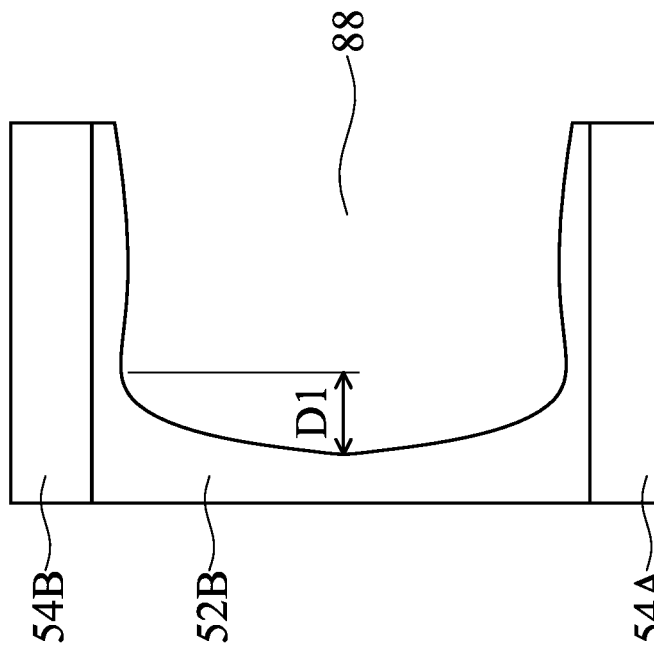

In FIGS. 10A and 10B, portions of sidewalls of the layers of the multi-layer stack 64 formed of the first semiconductor materials (e.g., the first semiconductor layers 52) exposed by the first recesses 86 are etched to form sidewall recesses 88 in the n-type region 50N and the p-type region 50P. The sidewall recesses 88 may have horizontal widths in a horizontal x direction in a range of about 4 nm to about 20 nm, vertical heights in a vertical y direction in a range of about 10 nm to about 18 nm, and aspect ratios of the heights to the widths in a range of about 2 to about 4.5. FIG. 10C illustrates a detailed view of region 50O as shown in FIG. 10B. Although sidewalls of the first semiconductor layers 52 in sidewall recesses 88 are illustrated as being concave in FIGS. 10B and 10C, the sidewalls may be straight or convex. The inner sidewalls of the sidewall recesses 88 may have a maximum horizontal distance D1 along the horizontal x direction between the inner sidewalls and a vertical line along the vertical y direction through top and bottom vertices of the sidewalls in a range of about 1.0 nm to about 2.0 nm.

The sidewalls may be etched using isotropic etching processes, such as wet etching or the like. In an embodiment in which the first semiconductor layers 52 include, e.g., SiGe, and the second semiconductor layers 54 include, e.g., Si or SiC, a dry etch process with tetramethylammonium hydroxide (TMAH), ammonium hydroxide (NH$_4$OH), or the like may be used to etch sidewalls of the first semiconductor layers 52.

Figure 11A:
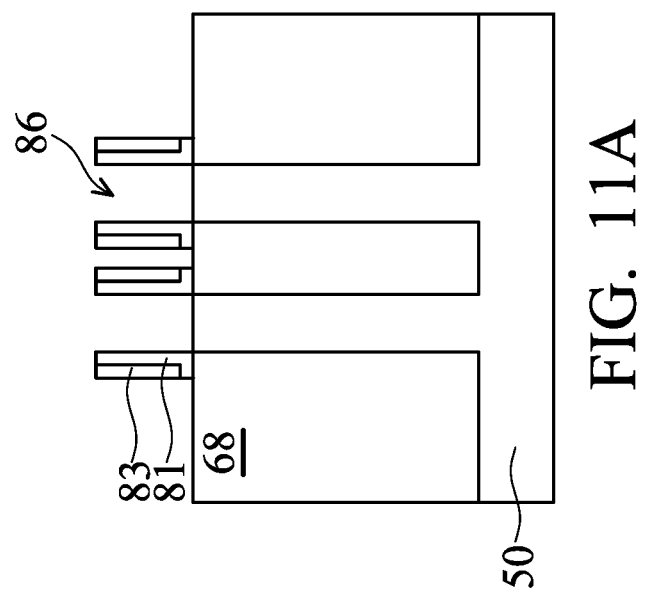
Figure 11B:
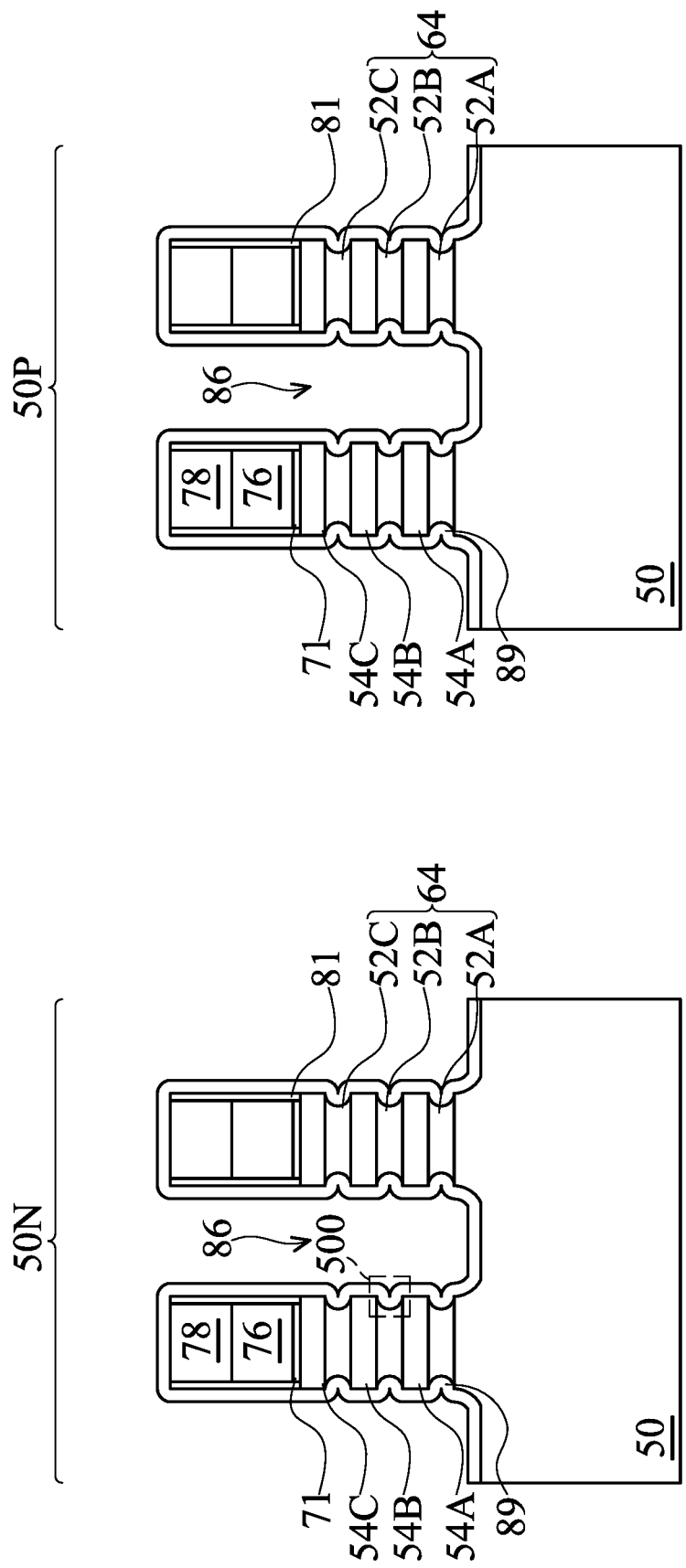

In FIGS. 11A-11C, an inner spacer layer 89 is formed over the structures illustrated in FIGS. 10A-10C, which will be subsequently used to form first inner spacers 90 that may act as isolation features between subsequently formed source/drain regions and a gate structure. The inner spacer layer 89 may be deposited over multiple nanostructures or nanosheets, such as e.g. pairs of multi-layer stacks 64 of first semiconductor layers 52 and second semiconductor layers 54. As will be discussed in greater detail below, source/drain regions will be formed in the recesses 86, while the first semiconductor layers 52 will be replaced with corresponding gate structures.

The inner spacer layer 89 may be deposited by a conformal deposition process, such as CVD, ALD, or the like. The inner spacer layer 89 may comprise a material such as silicon nitride, silicon oxynitride, silicon carbon nitride (SiCN), or silicon oxycarbonitride (SiOCN), although any suitable material, such as low-dielectric constant (low-k) materials having a k-value less than about 6.0, may be utilized.

In some embodiments in which the inner spacer layer 89 comprises a SiOCN film, H$_2$SiCl$_2$, C$_3$H$_6$, O$_2$, and NH$_3$ may be used as precursors for the SiOCN film. The SiOCN film may be formed with a thermal ALD in, e.g., a batch tool at a temperature in a range of about 600° C. to about 650° C. The inner spacer layer 89 may have a conformity greater than or equal to about 95% on the top surfaces, bottom surfaces, and sidewalls of the recesses 88 when the recesses 88 have aspect ratios of the heights to the widths greater than about 20. The SiOCN film may be a low-k film with a k-value in a range of about 4.5 to about 6.0. The atomic percentage of oxygen in the SiOCN film may be in a range of about 25% to about 55% with a greater percentage of oxygen closer to the sidewall of the SiOCN film exposed to the first recesses 86. The SiOCN film may have a density in a range of about 2.5 g/cm$^3$ to about 2.9 g/cm$^3$.

FIG. 11C illustrates a detailed view of region 50O as shown in FIG. 11B. The inner spacer layer 89 may be deposited to a thickness in a range of about 3 nm to about 7 nm. The inner spacer layer 89 may have seams 84 formed due to the inner spacer layer 89 being deposited conformally along sidewalls of the recesses 88. Seams 84 may be weak points in subsequent etching processes, such as e.g. an etch to form the first inner spacers 90 as described below with respect to FIGS. 14A-14C. The seams 84 may also lead to electrical shorts between channel regions and source/drain regions. Outer sidewalls of the inner spacer layer 89 (including the sidewalls facing each other forming the seams 84) may have Si—NH—Si bonds that may lead to the outer surface of the inner spacer layer 89 being hydrophilic, which may be disadvantageous for wet etching resistance during subsequent etching to form the first inner spacers 90. Embodiments of methods to reduce or mitigate the seams 84 and/or convert the outer surface of the first inner spacers from hydrophilic to hydrophobic are disclosed below with respect to FIGS. 12-13B.

Figure 12:
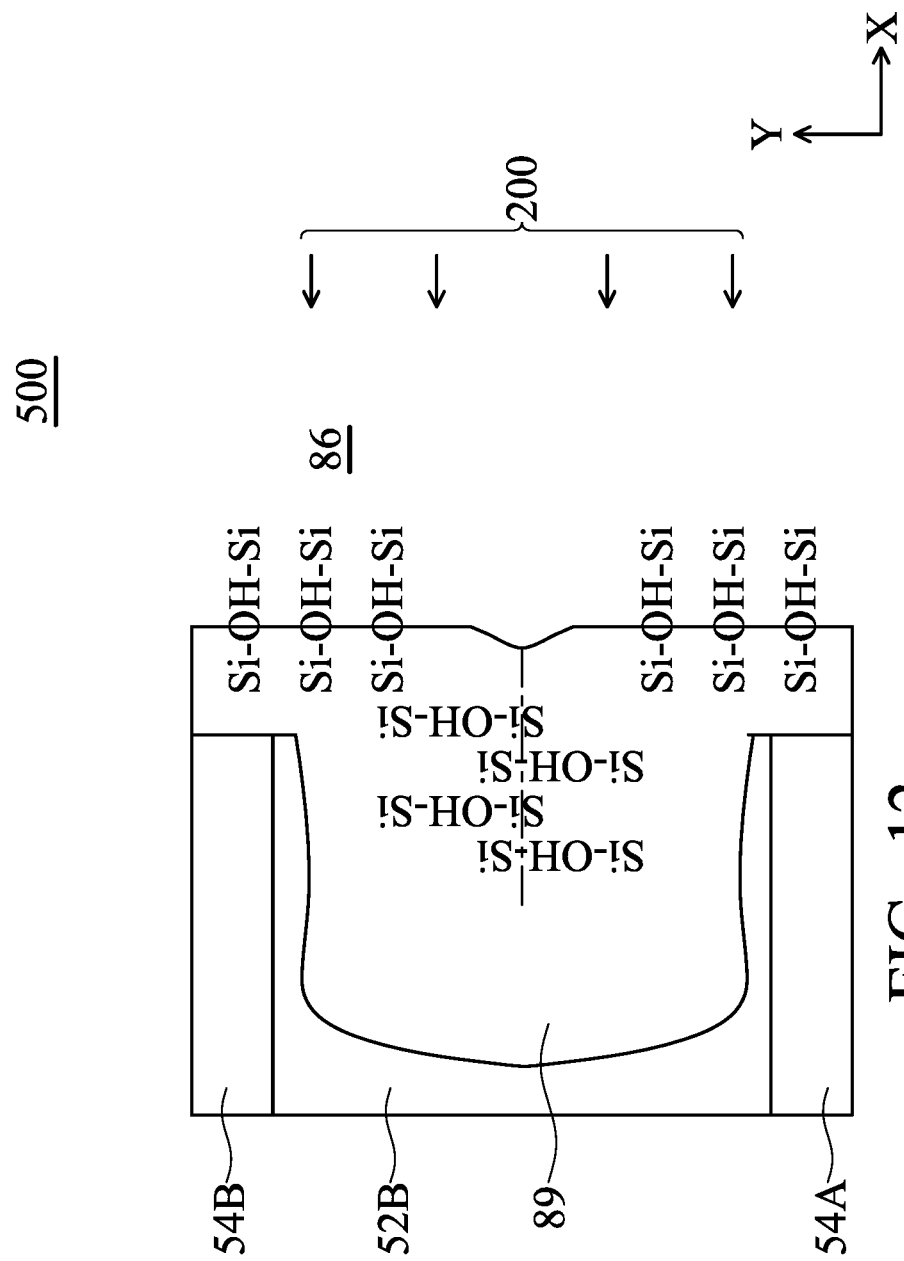

In FIG. 12, a wet anneal 200 is performed on the inner spacer layer 89. The wet anneal 200 may close the seams 84, which may reduce weak points for subsequent etching processes and/or electrical shorts. This may lead to improved device function by a reduction in the effective gate capacitance ($C_{eff}$) of subsequently produced nano-FET devices. In some embodiments, the wet anneal 200 is a steam ($H_2O$) anneal process performed in a furnace at a pressure in a range of about 0.95 atm to about 1 atm and at a temperature in a range of about 200° C. to about 600° C. The wet anneal 200 may reduce residual amines such as NH in the Si—NH—Si bonds shown above in FIG. 11C, converting the bonds to Si—OH—Si. The wet anneal 200 may cause the thickness of the inner spacer layer 89 to increase by about 10%.

In some embodiments in which the inner spacer layer 89 comprises SiOCN, the SiOCN film has gradients of varying atomic percentages of C, N, O, and Si. The atomic percentage of C may vary from about 2% measured near the surface of the inner spacer layer 89 adjacent to the first recess 86 to about 10% measured deeper in the inner spacer layer 89 adjacent to the first semiconductor layer 52. The atomic percentage of N may vary from about 5% measured near the surface of the inner spacer layer 89 adjacent to the first recess 86 to about 20% measured deeper in the inner spacer layer 89 adjacent to the first semiconductor layer 52. The atomic percentage of O may vary from about 60% measured near the surface of the inner spacer layer 89 adjacent to the first recess 86 to about 30% measured deeper in the inner spacer layer 89 adjacent to the first semiconductor layer 52. The atomic percentage of Si may vary from about 35% measured near the surface of the inner spacer layer 89 adjacent to the first recess 86 to about 45% measured deeper in the inner spacer layer 89 adjacent to the first semiconductor layer 52. The depth of the oxidized gradient layer in the SiOCN film may be in a range of about 60 Å to about 70 Å. After the wet anneal 200, the inner spacer layer 89 may have a k-value in a range of about 4.4 to about 5.3, such as 4.5 to 5.1.

Figure 13A:
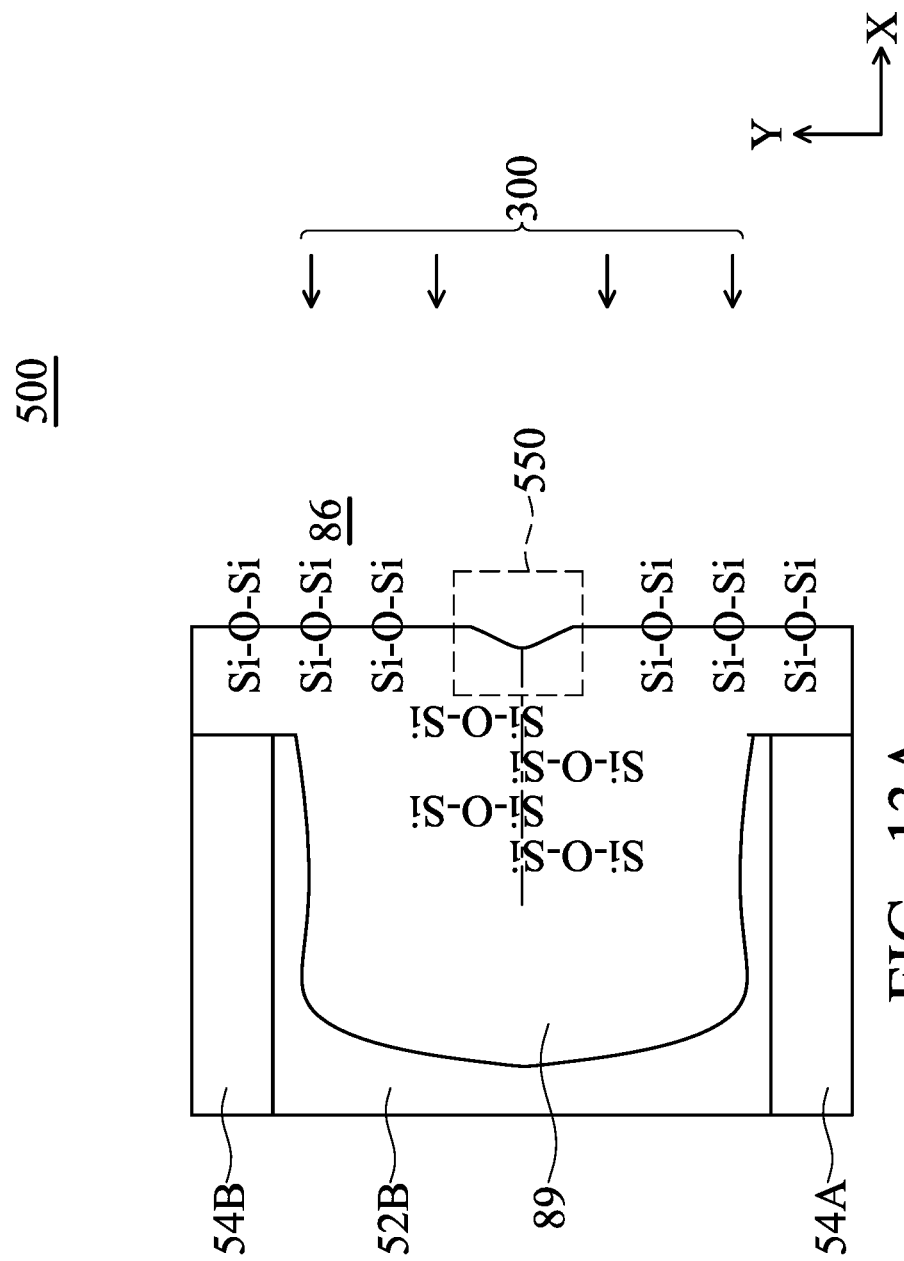

In FIG. 13A, a dry anneal 300 is performed on the inner spacer layer 89. The dry anneal 300 may further close the seams 84 by reducing polarization and terminating the Si—OH bonds. This may convert the Si—OH—Si bonds to Si—O—Si bonds, which may be useful in closing the seams 84 by bond cross-linking and by producing a hydrophobic surface. In some embodiments, the dry anneal 300 is performed with $N_2$, at a temperature in a range of about 600° C. to about 700° C. The intensity or bonding strength of the Si—O—Si bonding may be increased to a wavelength in a range of about 1070 $cm^{-1}$ to about 1200 $cm^{-1}$ as measured by FTIR after the wet anneal 200 and the dry anneal 300 are performed.

Figure 13B:
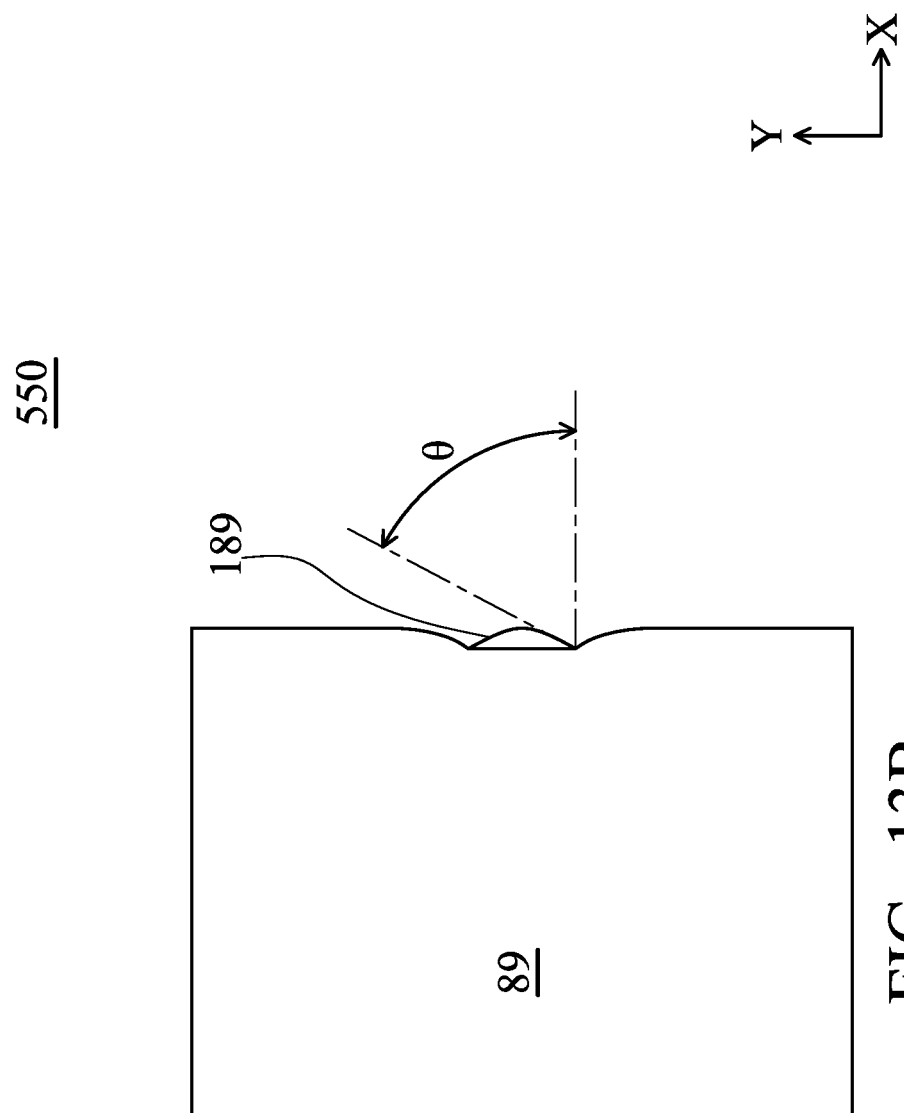

FIG. 13B illustrates a detailed view of region 550 as shown in FIG. 13A with a drop of liquid 189, such as e.g. $H_2O$, on the surface of the seam 84. A contact angle θ may be measured between a horizontal line parallel to a top surface of the substrate 50 and the surface of the drop of liquid 189. Due to residual amines such as NH in the Si—NH—Si bonds as shown above in FIG. 11C, the outer surface of the inner spacer layer 89 may be hydrophilic prior to the wet anneal 200 and/or the dry anneal 300, which may lead to the contact angle θ being in a range of about 20° to about 35°, such as about 25° to about 30°. This may be disadvantageous by leading to reduced wet etching resistance which may result in greater dishing of the subsequently formed first inner spacers 90. After performing the wet anneal 200 and/or the dry anneal 300, the Si—NH—Si bonds may be converted to Si—O—Si bonds leading to a hydrophobic surface with the contact angle θ expanded to a range of about 30° to about 45°, such as about 33° to about 40°. This may be advantageous by leading to increased wet etching resistance which may result in less dishing of the subsequently formed first inner spacers 90.

Figure 14B:
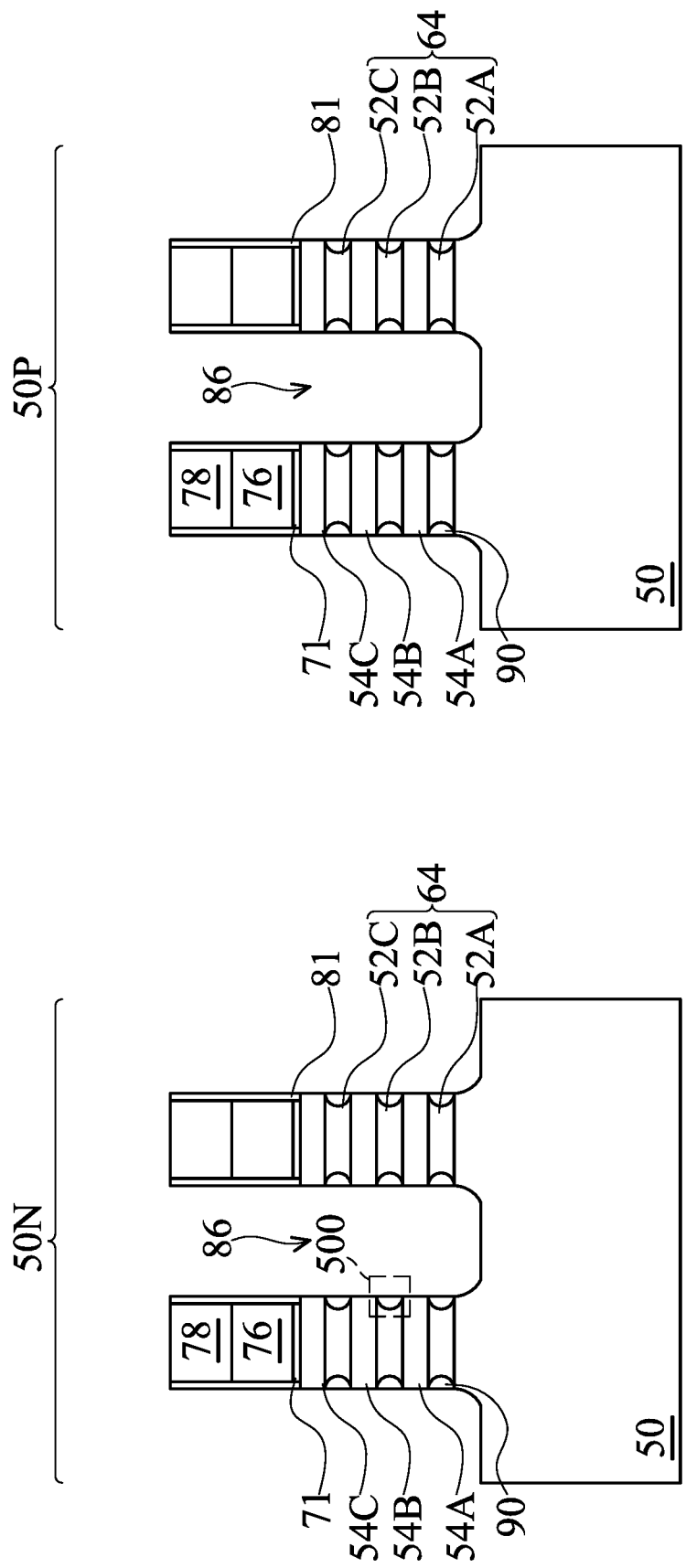
Figure 14C:
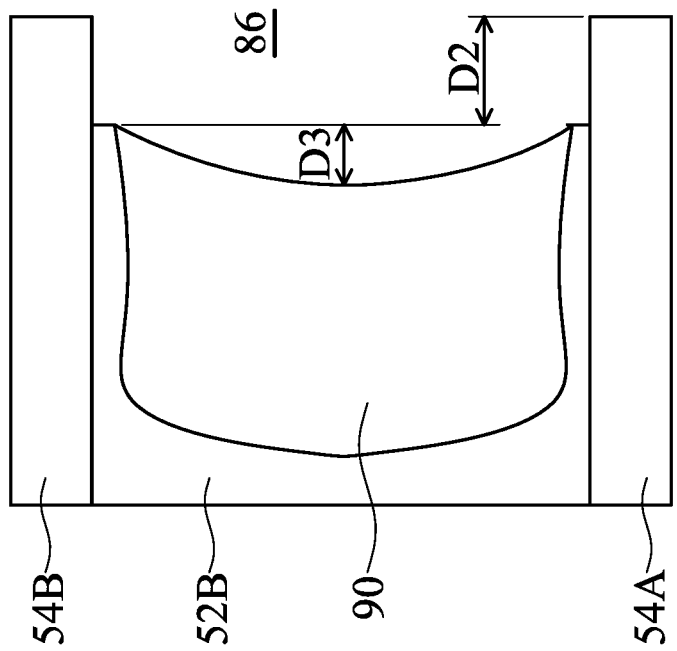

Next in FIGS. 14A and 14B, the inner spacer layer 89 is etched to form the first inner spacers 90. FIG. 14C illustrates a detailed view of region 500 as shown in FIG. 14B. In some embodiments, the etching is performed with a wet etch process such as with HF, $H_2O_2$+$H_2O$+HCl, $H_2O_2$+$H_2O$+$NH_3$, a high temperature sulfuric peroxide mix ($H_2SO_4$+$H_2O_2$), $H_2SO_4$+$H_2O_2$+$H_2O$, the like, or a combination thereof. The wet etch process may be performed for a duration in a range of about 10 minutes to about 20 minutes at a temperature of around 170° C. Although outer sidewalls of the first inner spacers 90 are illustrated as being flush with sidewalls of the second semiconductor layers 54, the outer sidewalls of the first inner spacers 90 may extend beyond or be recessed from sidewalls of the second semiconductor layers 54. In some embodiments, the etching loss of the first inner spacers 90 measured between the outer sidewall of the first inner spacers 90 and the outer sidewall of the multi-layer stack 64 may be a distance D2 of about 1 nm. The first inner spacers 90 may have a horizontal width in the x direction in a range of about 8 nm to about 14 nm.

Moreover, although the outer sidewalls of the first inner spacers 90 are illustrated as being straight in FIG. 14B, the outer sidewalls of the first inner spacers 90 may be concave or convex. As an example, FIG. 14C illustrates an embodiment in which a sidewall of the first semiconductor layer 52B is concave, an outer sidewall of the first inner spacer 90 are concave, and the first inner spacers are recessed from sidewalls of the second semiconductor layers 54. The outer sidewalls of the first inner spacers 90 being concave may be referred to as dishing. In some embodiments, the distance D3 of the dishing of the first inner spacers is smaller than 3.2 nm, such as less than about 0.5 nm. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 15A-15C) by subsequent etching processes, such as etching processes used to form gate structures.

In some embodiments, after etching the inner spacer layer 89 to form first inner spacers 90, the inner spacers 90 have gradients of varying atomic percentages of C, N, O, and Si. The atomic percentage of C may vary from about 7% measured near the surface of the inner spacers 90 adjacent to the first recess 86 to about 9% measured deeper in the inner spacers 90 adjacent to the first semiconductor layer 52. The atomic percentage of N may vary from about 20% measured near the surface of the inner spacers 90 adjacent to the first recess 86 to about 25% measured deeper in the inner spacers 90 adjacent to the first semiconductor layer 52. The atomic percentage of O may vary from about 35% measured near the surface of the inner spacers 90 adjacent to the first recess 86 to about 30% measured deeper in the inner spacers 90 adjacent to the first semiconductor layer 52. The depth of the oxidized gradient layer in the inner spacers 90 may be in a range of about 1 nm to about 5 nm.

Figure 15B:
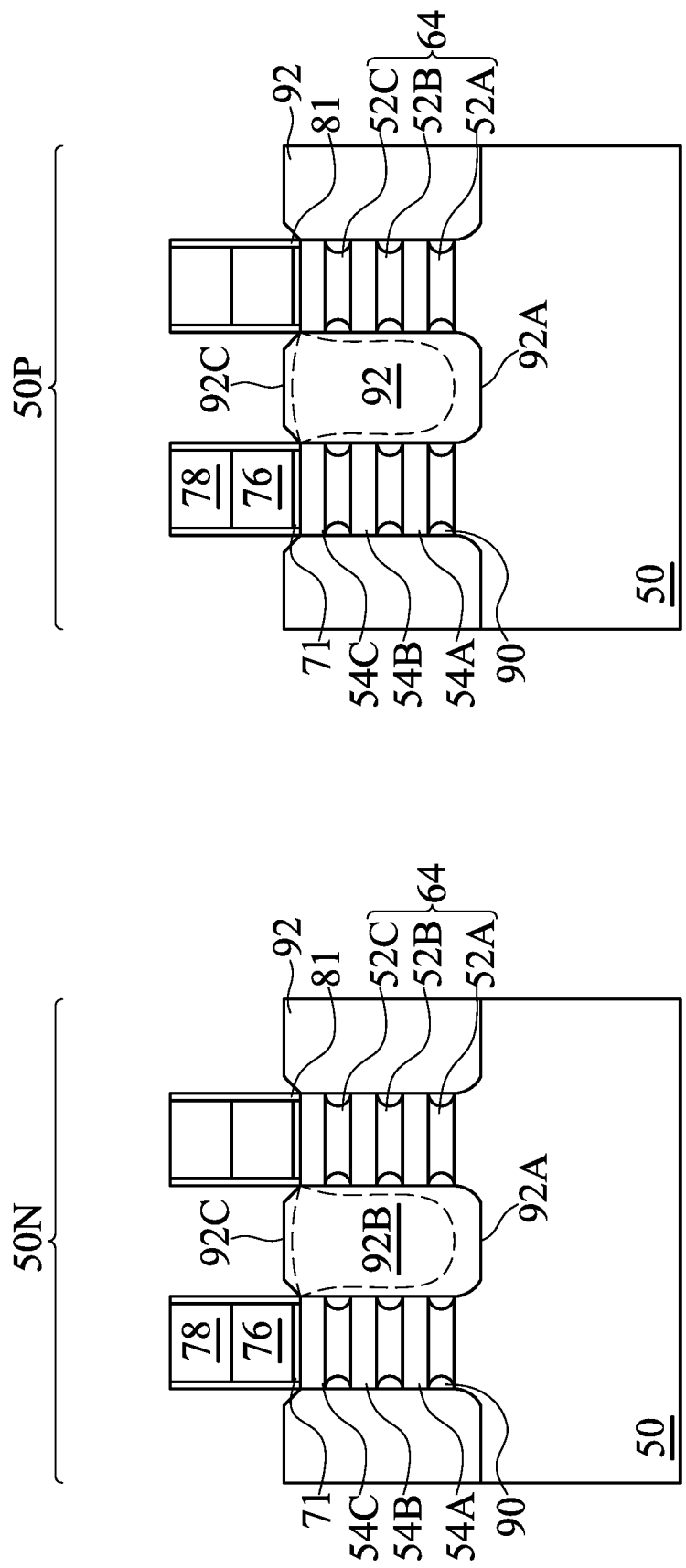

In FIGS. 15A-15C, epitaxial source/drain regions 92 are formed in the first recesses 86 to exert stress on the second semiconductor layers 54 of the nanostructures 66, thereby improving performance. As illustrated in FIG. 15B, the epitaxial source/drain regions 92 are formed in the first recesses 86 such that each dummy gate 76 is disposed between respective neighboring pairs of the epitaxial source/drain regions 92. In some embodiments, the first spacers 81 are used to separate the epitaxial source/drain regions 92 from the dummy gates 76 by an appropriate lateral distance so that the epitaxial source/drain regions 92 do not short out with subsequently formed gates of the resulting nano-FETs. The first inner spacers 90 may be used to separate the epitaxial source/drain regions 92 from the first semiconductor layers 52A-52C by appropriate lateral distances to prevent shorts between the epitaxial source/drain regions 92 and the subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 in the n-type region 50N. The epitaxial source/drain regions 92 may include any acceptable material appropriate for n-type nano-FETs. For example, if the second semiconductor layers 54 are silicon, the epitaxial source/drain regions 92 may include materials exerting a tensile strain on the second semiconductor layers 54, such as silicon, silicon carbide, phosphorous doped silicon carbide, silicon phosphide, or the like. The epitaxial source/drain regions 92 may have surfaces raised from respective surfaces of the multi-layer stack 66 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 in the p-type region 50P. The epitaxial source/drain regions 92 may include any acceptable material appropriate for p-type nano-FETs. For example, if the second semiconductor layers 54 are silicon, the epitaxial source/drain regions 92 may include materials exerting a tensile strain on the second semiconductor layers 54, such as silicon, silicon carbide, boron doped silicon carbide, or the like. The epitaxial source/drain regions 92 may also have surfaces raised from respective surfaces of the multi-layer stack 64 and may have facets.

The epitaxial source/drain regions 92, the first semiconductor layers 52, the second semiconductor layers 54, and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 66. In some embodiments, these facets cause adjacent epitaxial source/drain regions 92 of a same nano-FET to merge as illustrated by FIG. 15A. In other embodiments, adjacent epitaxial source/drain regions 92 remain separated after the epitaxy process is completed as illustrated by FIG. 15C. Subsequent figures illustrate the embodiment of FIG. 15A, but the processes and structures illustrated therein are also applicable to the embodiment of FIG. 15C. In the embodiments illustrated in FIGS. 15A and 15C, the first spacers 81 may be formed covering portions of the sidewalls of the nanostructures 66 and the substrate 50 that extend above the STI regions 68 thereby blocking the epitaxial growth. In some other embodiments, the spacer etch used to form the first spacers 81 may be adjusted to remove the spacer material to allow the epitaxially grown region to extend to the surface of the STI region 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 15D:
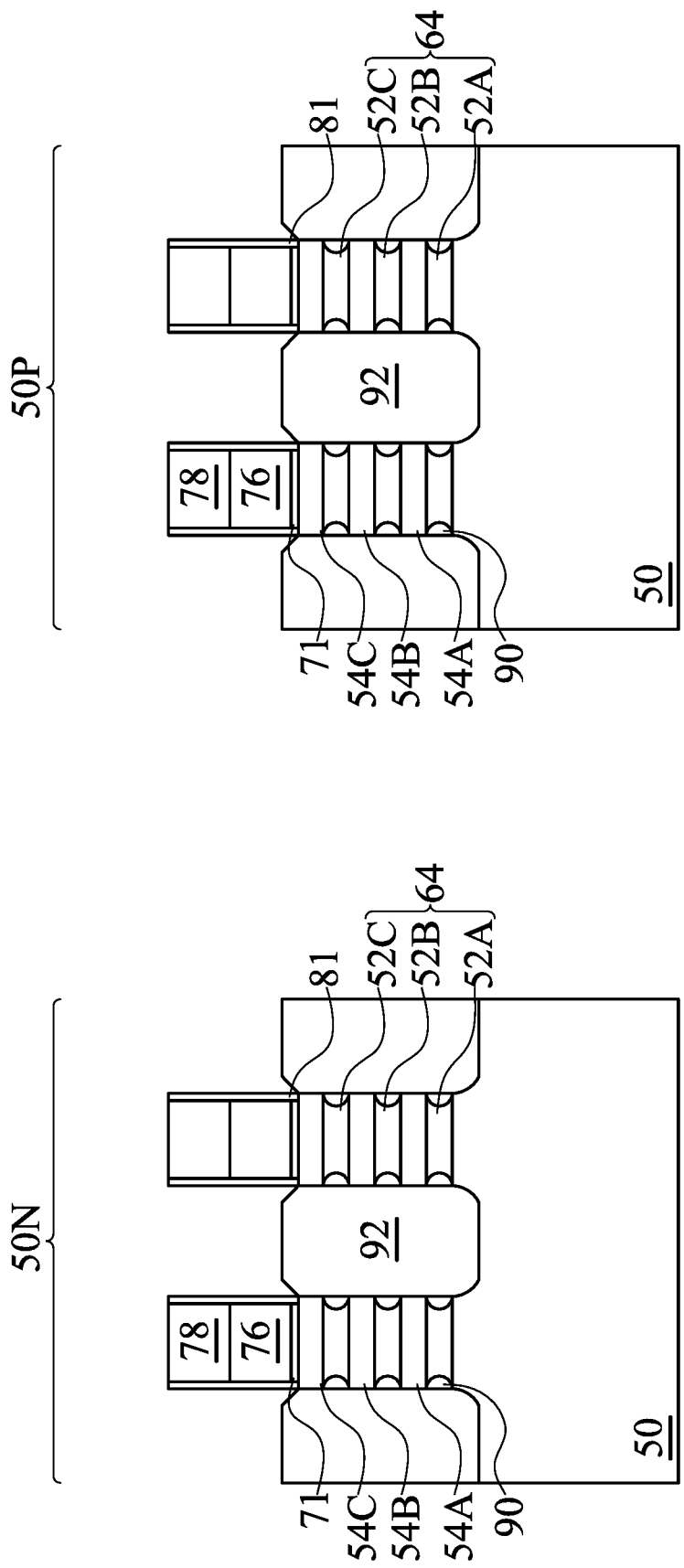

FIG. 15D illustrates an embodiment in which sidewalls of the first semiconductor layers 52 are concave, outer sidewalls of the first inner spacers 90 are concave, and the first inner spacers 90 are recessed from sidewalls of the second semiconductor layers 54. As illustrated in FIG. 15D, the epitaxial source/drain regions 92 may be formed in contact with the first inner spacers 90 and may extend past sidewalls of the second semiconductor layers 54.

Figure 16A:
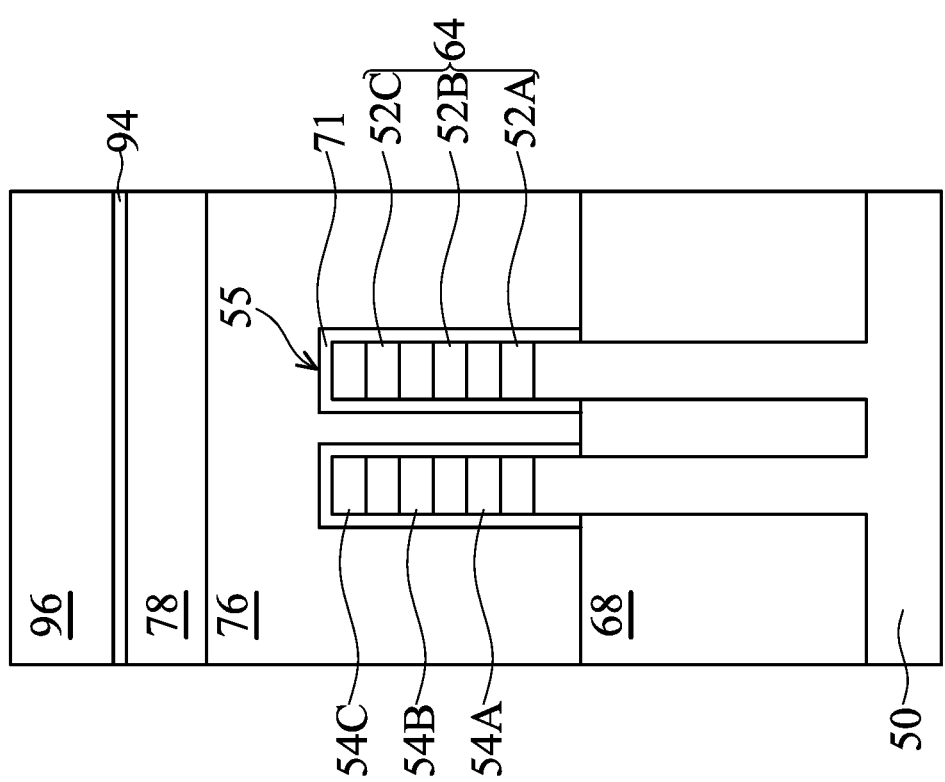
Figure 16B:
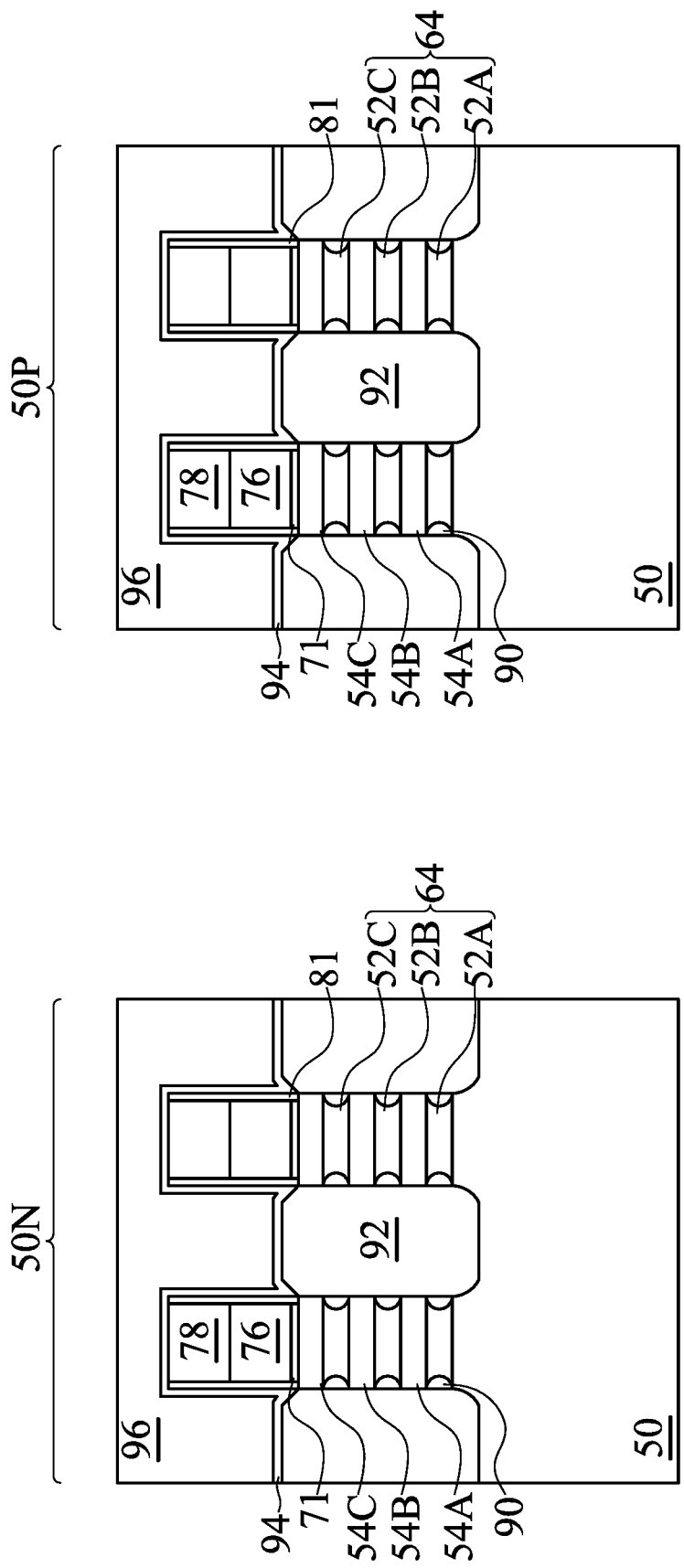
Figure 16C:
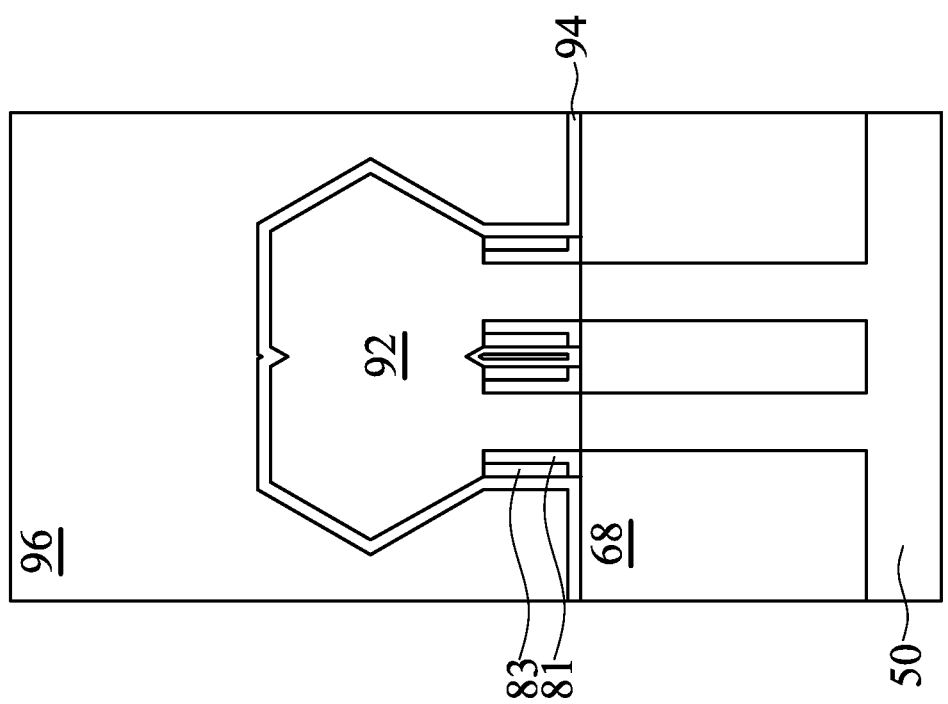

In FIGS. 16A-16C, a first interlayer dielectric (ILD) 96 is deposited over the structure illustrated in FIGS. 6A, 15B, and 15A (the processes of FIGS. 7A-15D do not alter the cross-section illustrated in FIGS. 6A), respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 74, and the first spacers 81. The CESL 94 may comprise a dielectric material, such as silicon nitride, silicon oxide, silicon oxynitride, or the like, having a different etch rate than the material of the overlying first ILD 96.

Figure 17A:
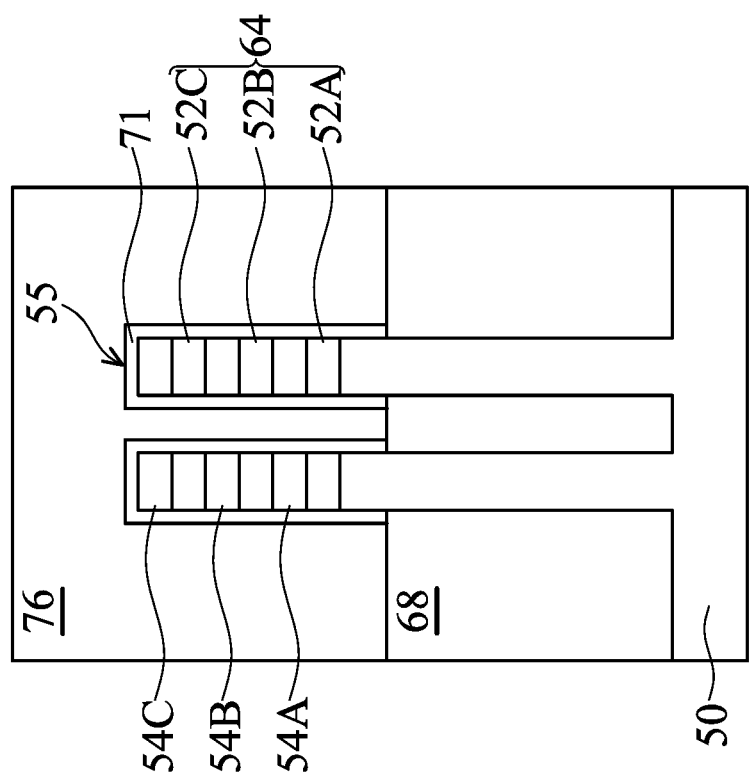
Figure 17B:
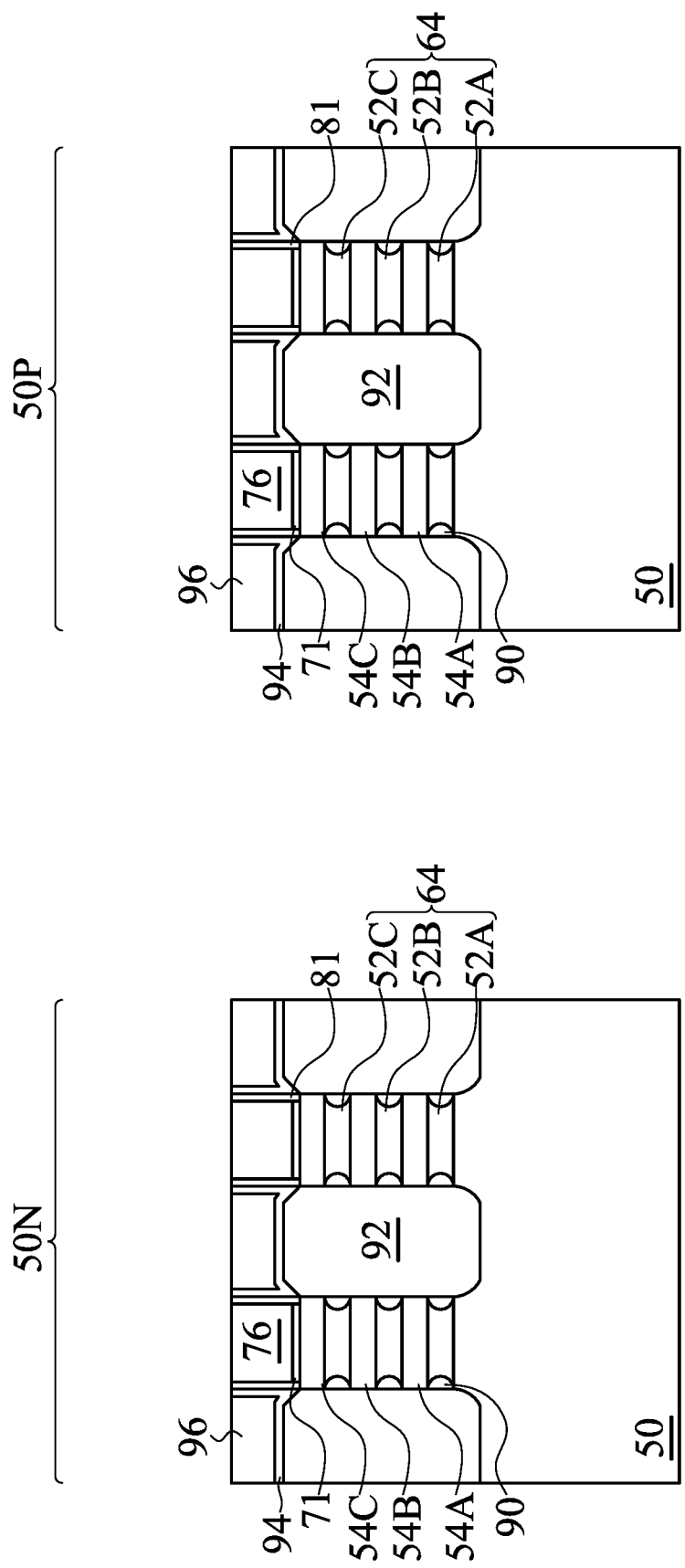

In FIGS. 17A and 17B, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with top surface of the masks 78 and the first spacers 81.

Figure 18A:
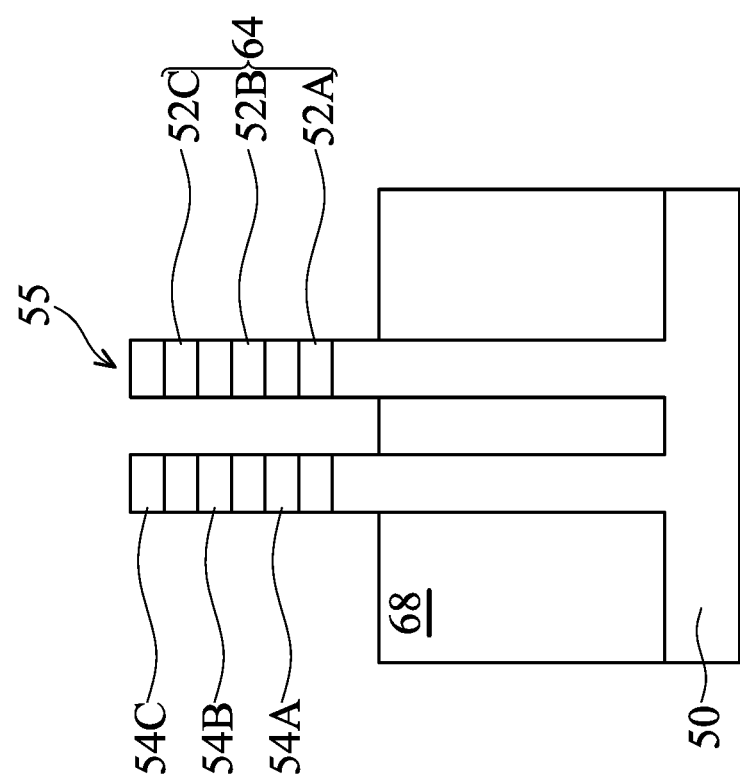
Figure 18B:
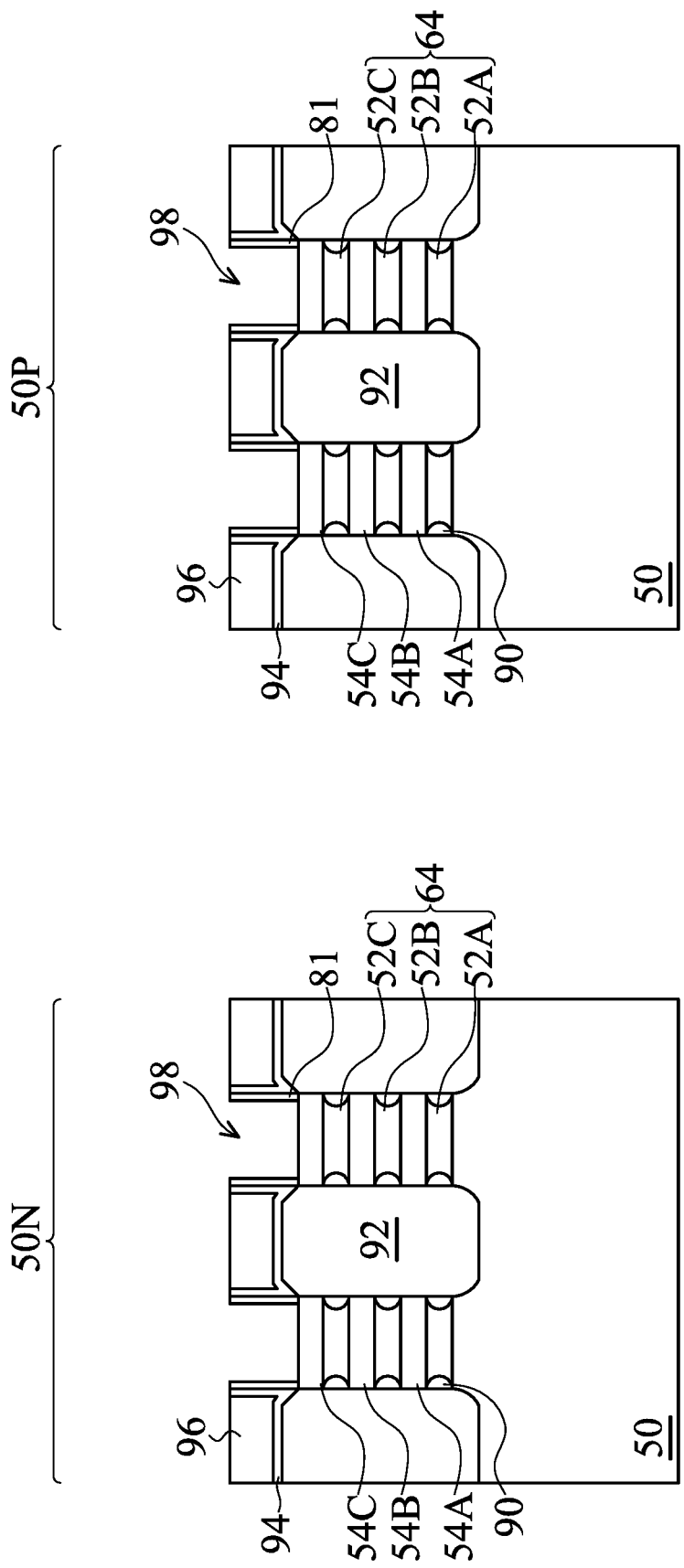

In FIGS. 18A and 18B, the dummy gates 76, and the masks 78 if present, are removed in one or more etching steps, so that second recesses 98 are formed. Portions of the dummy gate dielectrics 71 in the second recesses 98 are also be removed. In some embodiments, the dummy gates 76 and the dummy gate dielectrics 60 are removed by an anisotropic dry etch process. For example, the etching process may include a dry etch process using reaction gas(es) that selectively etch the dummy gates 76 at a faster rate than the first ILD 96 or the first spacers 81. Each second recess 98 exposes and/or overlies portions of the multi-layer stack 66, which act as channel regions in subsequently completed nano-FETs. Portions of the multi-layer stack 64 which act as the channel regions are disposed between neighboring pairs of the epitaxial source/drain regions 92. During the removal, the dummy gate dielectrics 71 may be used as etch stop layers when the dummy gates 76 are etched. The dummy gate dielectrics 71 may then be removed after the removal of the dummy gates 76.

Figure 19A:
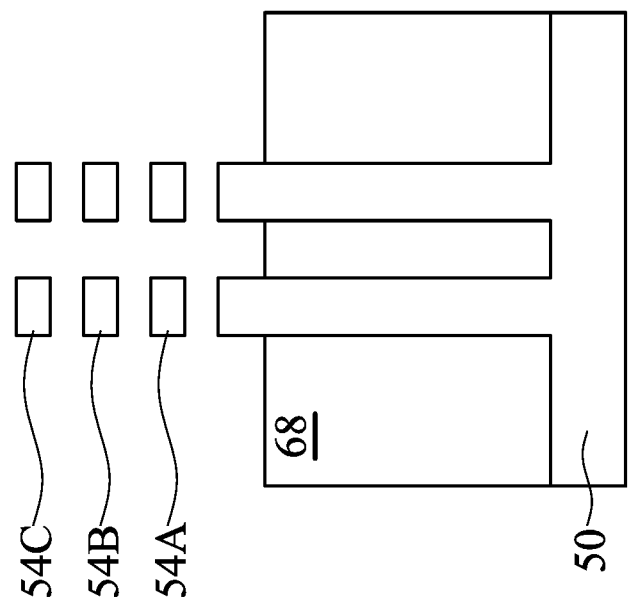
Figure 19B:
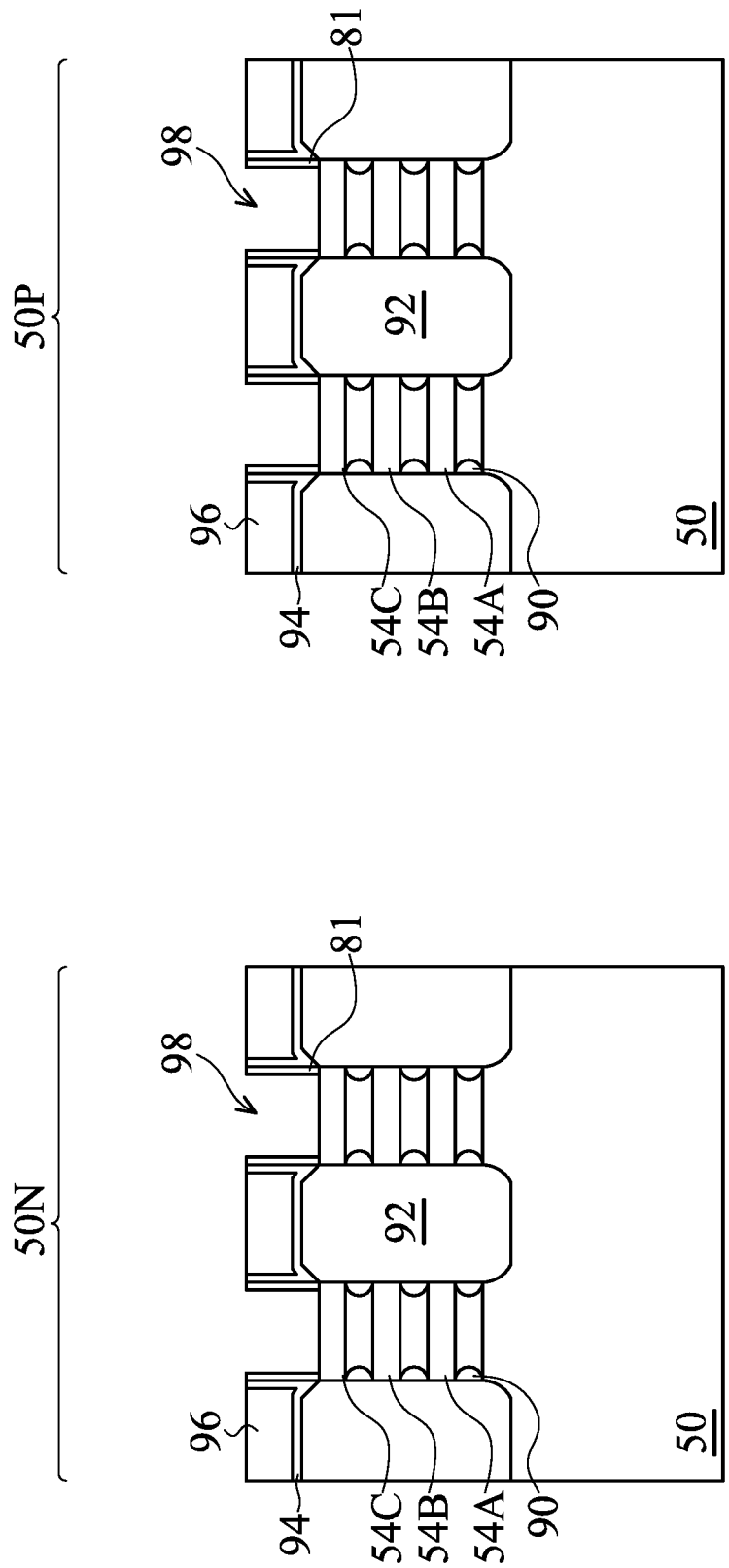

In FIGS. 19A and 19B, the first semiconductor layers 52 are removed, extending the second recesses 98. The first semiconductor layers 52 may be removed by performing an isotropic etching process such as wet etching or the like using etchants which are selective to the materials of the first semiconductor layers 52, while the second semiconductor layers 54, the substrate 50, the STI regions 68 remain relatively unetched as compared to the first semiconductor layers 52. In embodiments in which the first semiconductor layers 52 include, e.g., SiGe, and the second semiconductor layers 54A-54C include, e.g., Si or SiC, tetramethylammonium hydroxide (TMAH), ammonium hydroxide (NH$_4$OH), or the like may be used to remove the first semiconductor layers 52.

Figure 20A:
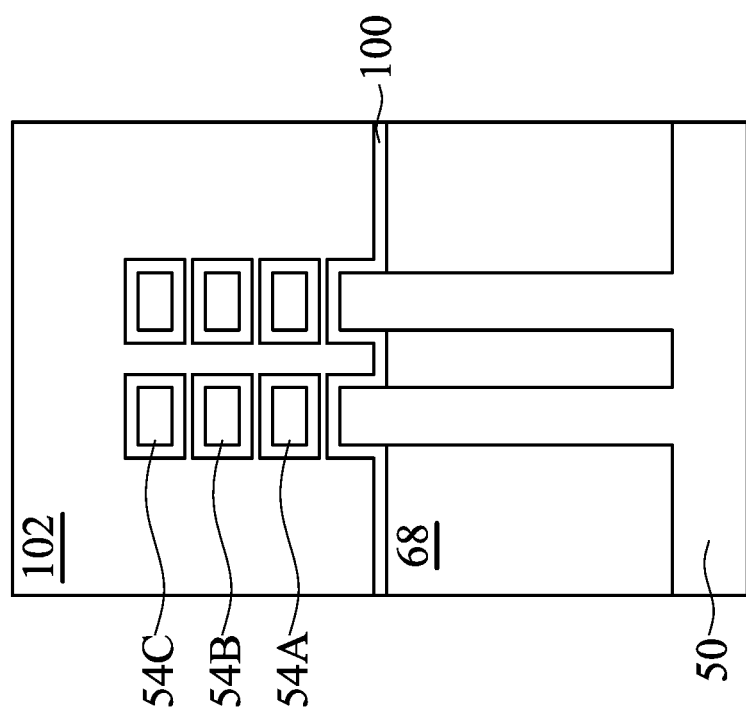

In FIGS. 20A and 20B, gate dielectric layers 100 and gate electrodes 102 are formed for replacement gates, also referred to as gate stacks. The gate dielectric layers 100 are deposited conformally in the second recesses 98. The gate dielectric layers 100 may be formed on top surfaces and sidewalls of the substrate 50 and on top surfaces, sidewalls, and bottom surfaces of the second semiconductor layers 54. The gate dielectric layers 100 may also be deposited on top surfaces of the first ILD 96, the CESL 94, the first spacers 81, and the STI regions 68.

In accordance with some embodiments, the gate dielectric layers 100 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 20A and 20B, the gate electrodes 102 may comprise any number of liner layers, any number of work function tuning layers, and a fill material. Any combination of the layers which make up the gate electrodes 102 may be deposited between adjacent ones of the second semiconductor layers 54 and between the second semiconductor layer 54A and the substrate 50.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the second recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting NSFETs. The gate electrodes 102 and the gate dielectric layers 100 may be collectively referred to as "gate structures." In some embodiments, the gate structures have a length in a range of about 13.0 nm to about 16.0 nm.

Figure 21A:
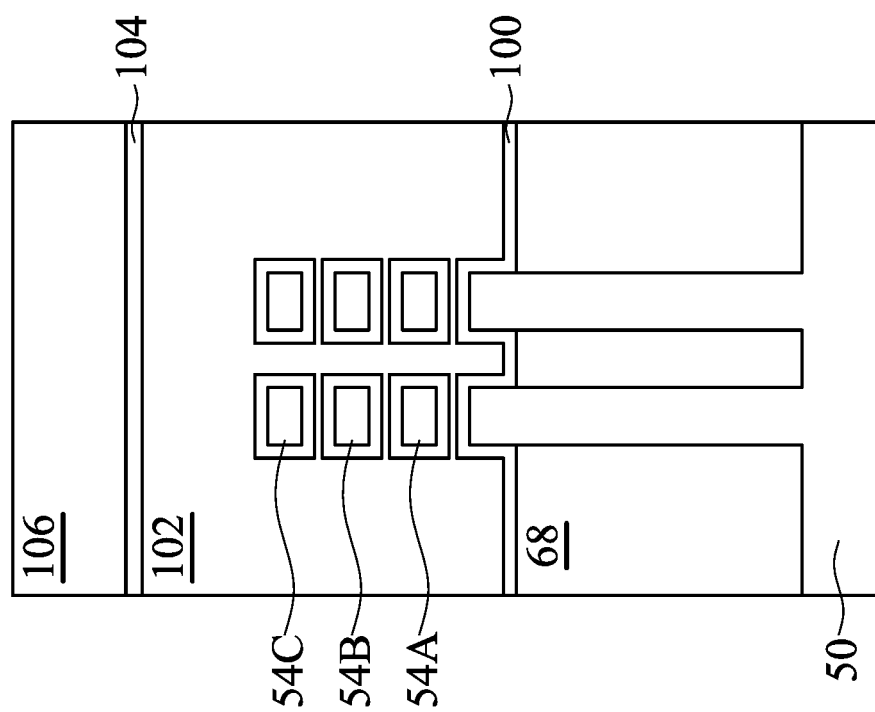
Figure 21B:
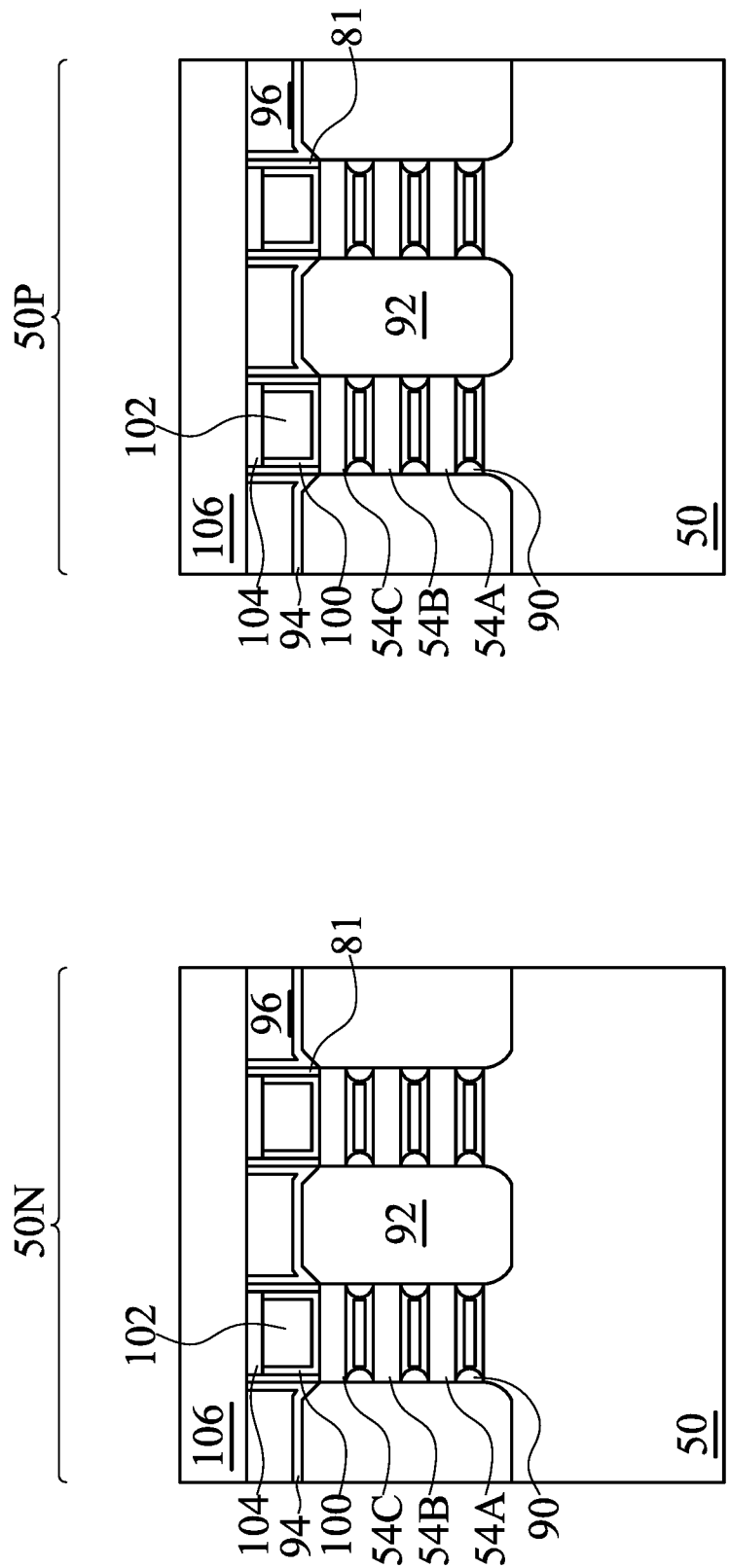
Figure 21C:
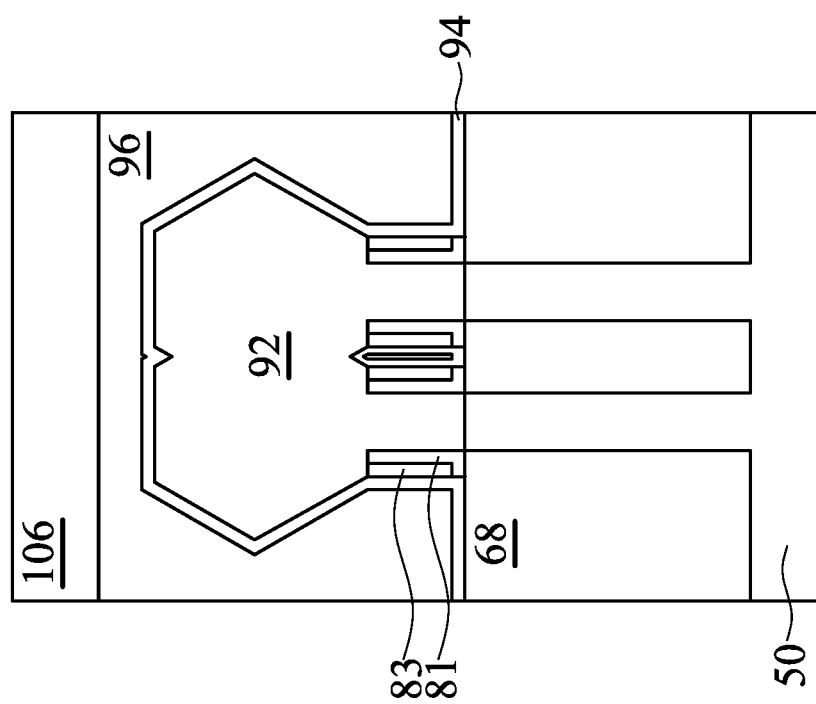

In FIGS. 21A-21C, a second ILD 106 is deposited over the first ILD 96. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like. In accordance with some embodiments, before the formation of the second ILD 106, the gate structure (including the gate dielectric layers 100 and the corresponding overlying gate electrodes 102) is recessed, so that a recess is formed directly over the gate structure and between opposing portions of first spacers 81. A gate mask 104 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the contacts 112, discussed below with respect to FIGS. 23A and 23B) penetrate through the gate mask 104 to contact the top surface of the recessed gate electrodes 102.

Figure 22A:
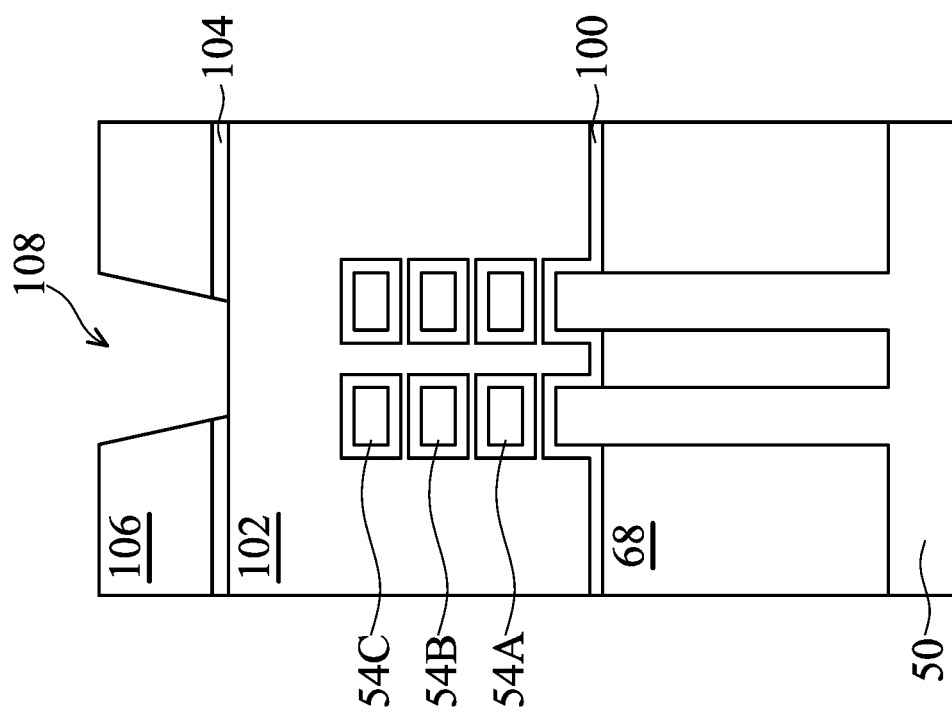
Figure 22B:
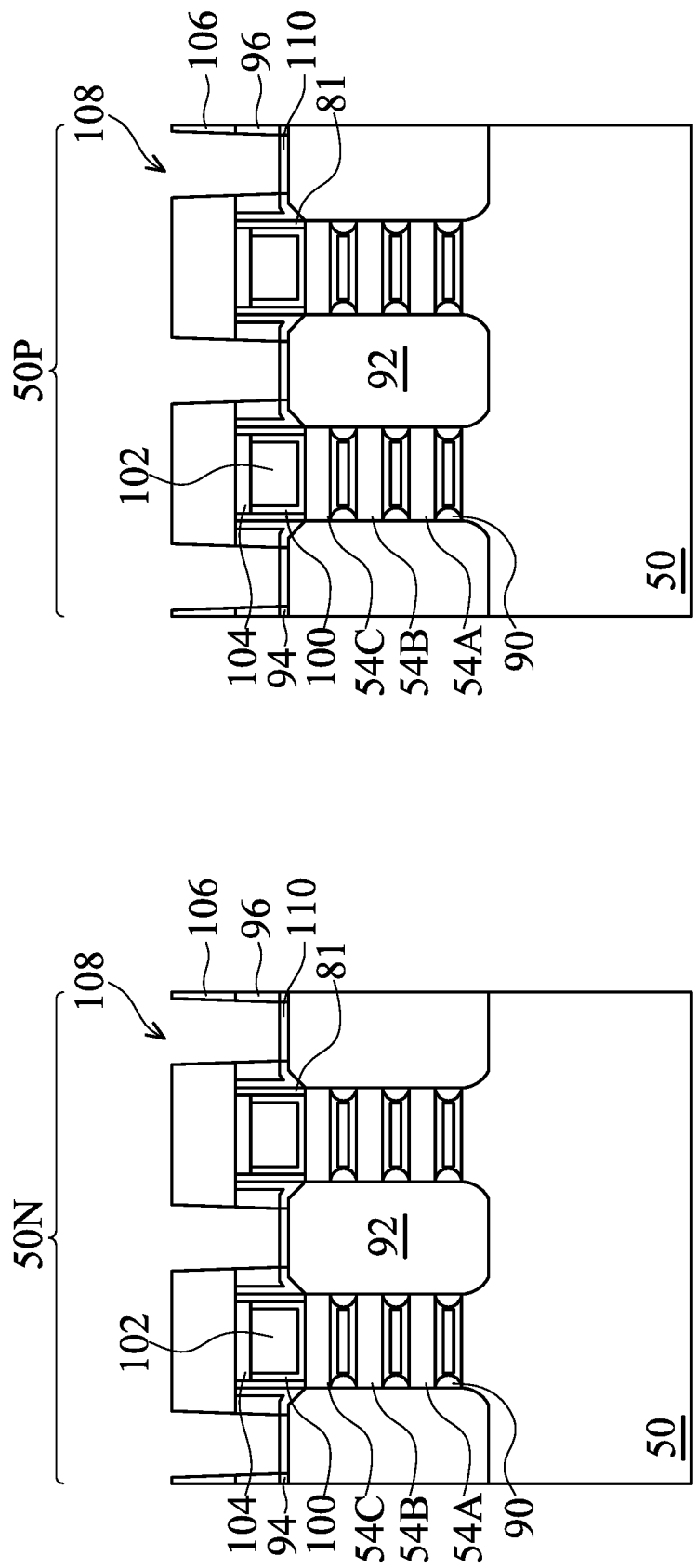
Figure 22C:
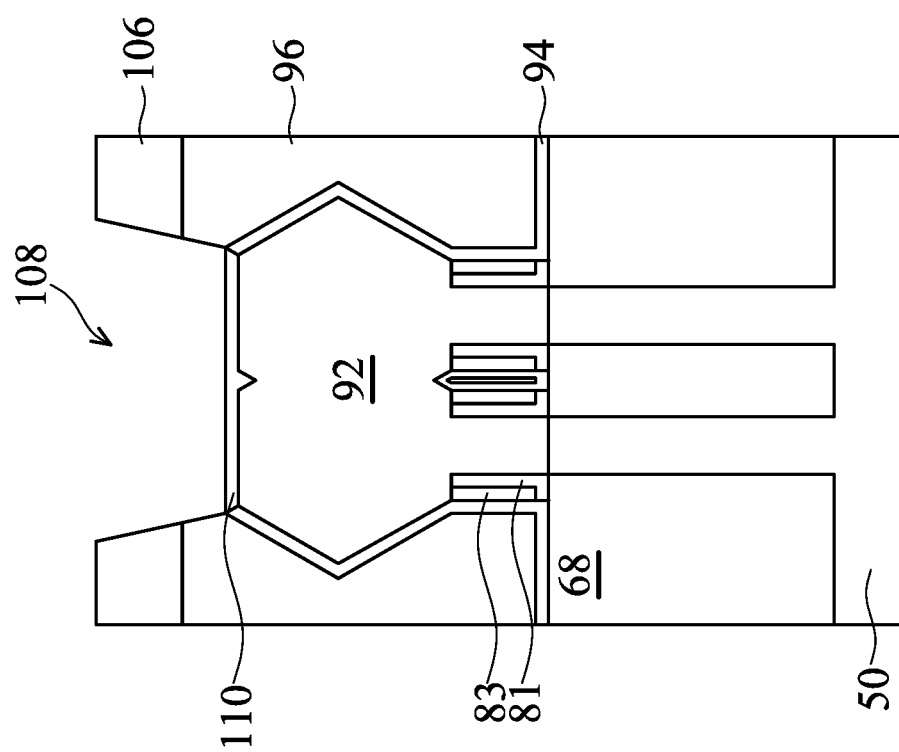

In FIGS. 22A-22C, the second ILD 106, the first ILD 96, the CESL 94, and the gate mask 104 are etched to form third recesses 108 exposing surfaces of the epitaxial source/drain regions 92 and/or the gate structure. The third recesses 108 may be formed by etching using an anisotropic etching process, such as RIE, NBE, or the like. In some embodiments, the third recesses 108 may be etched through the second ILD 106 and the first ILD 96 using a first etching process and may then be etched through the CESL 94 using a second etching process. A mask, such as a photoresist, may be formed and patterned over the second ILD 106 to mask portions of the second ILD 106 from the first etching process and the second etching process. In some embodiments, the etching process may over-etch, and therefore, the third recesses 108 extend into the epitaxial source/drain regions 92, and a bottom of the third recesses 108 may be level with (e.g., at a same level, or having a same distance from the substrate), or lower than (e.g., closer to the substrate) a bottom of the gate structure.

After the third recesses 108 are formed, silicide regions 110 are formed over the epitaxial source/drain regions 92. In some embodiments, the silicide regions 110 are formed by first depositing a metal (not shown) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 110. The un-reacted portions of the deposited metal are then removed, e.g., by an etching process. Although silicide regions 110 are referred to as silicide regions, silicide regions 110 may also be germanide regions, or silicon germanide regions (e.g., regions comprising silicide and germanide). In an embodiment, the silicide region 110 comprises TiSi, and has a thickness in a range between about 2 nm and about 10 nm.

Figure 23A:
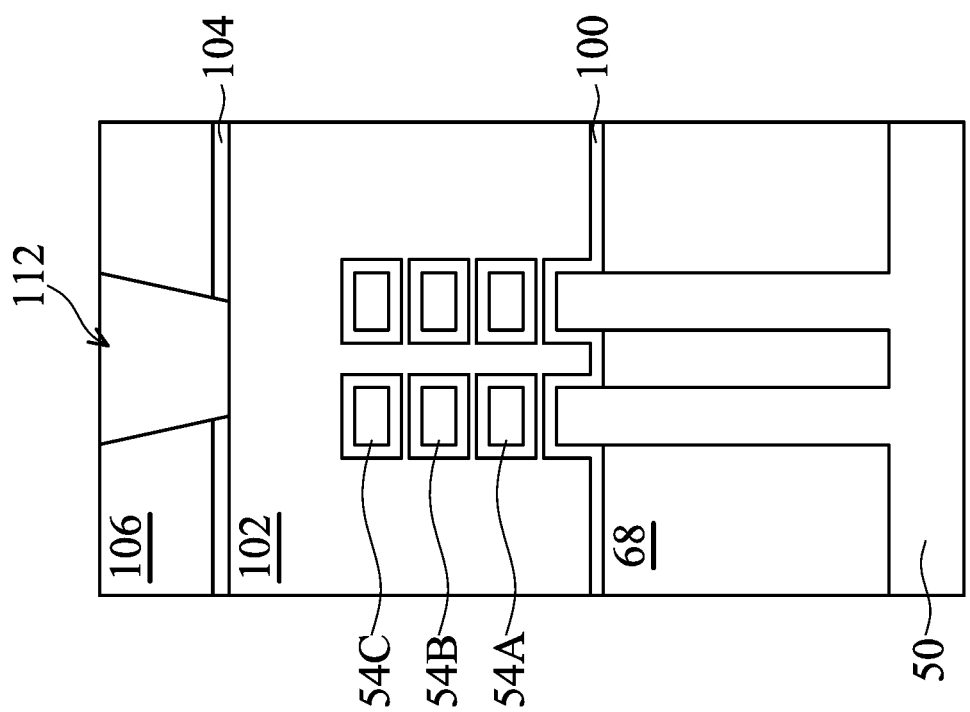
Figure 23B:
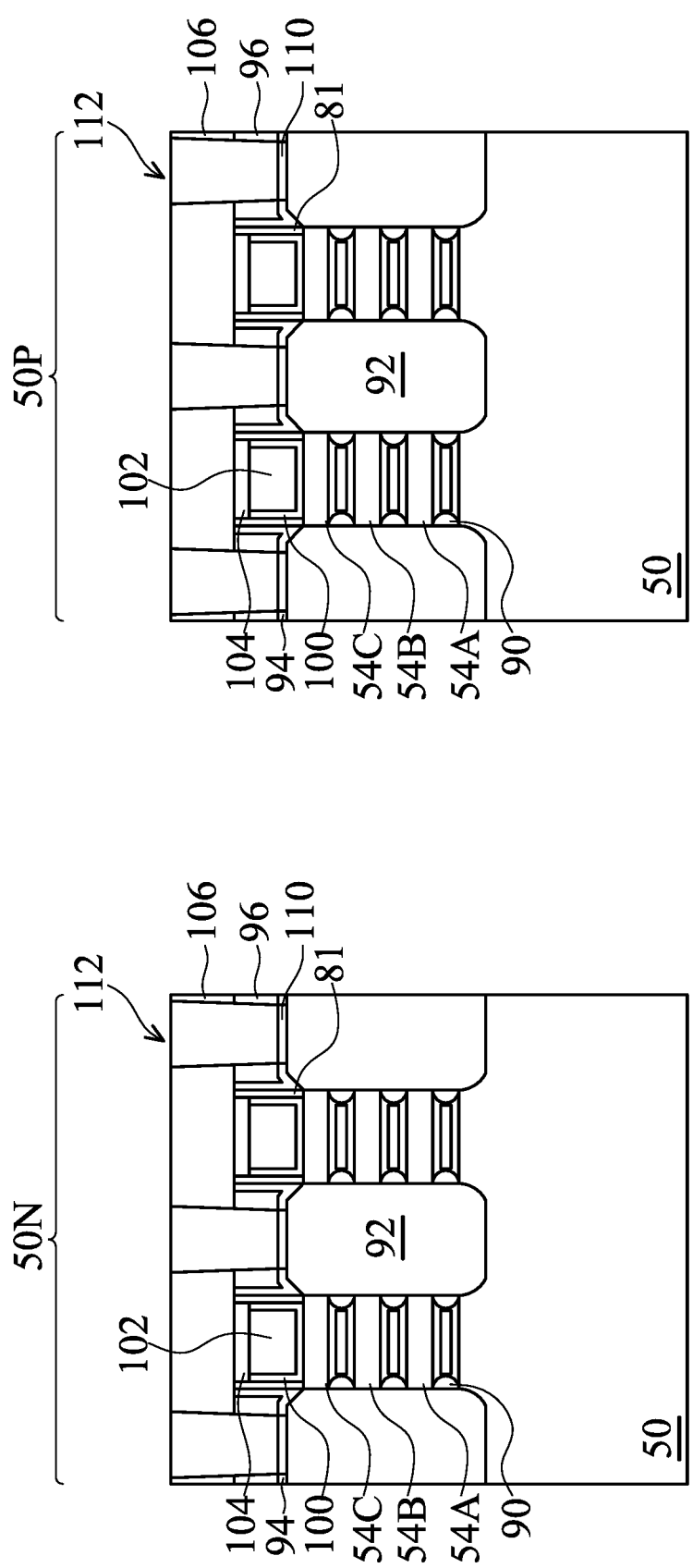
Figure 23C:
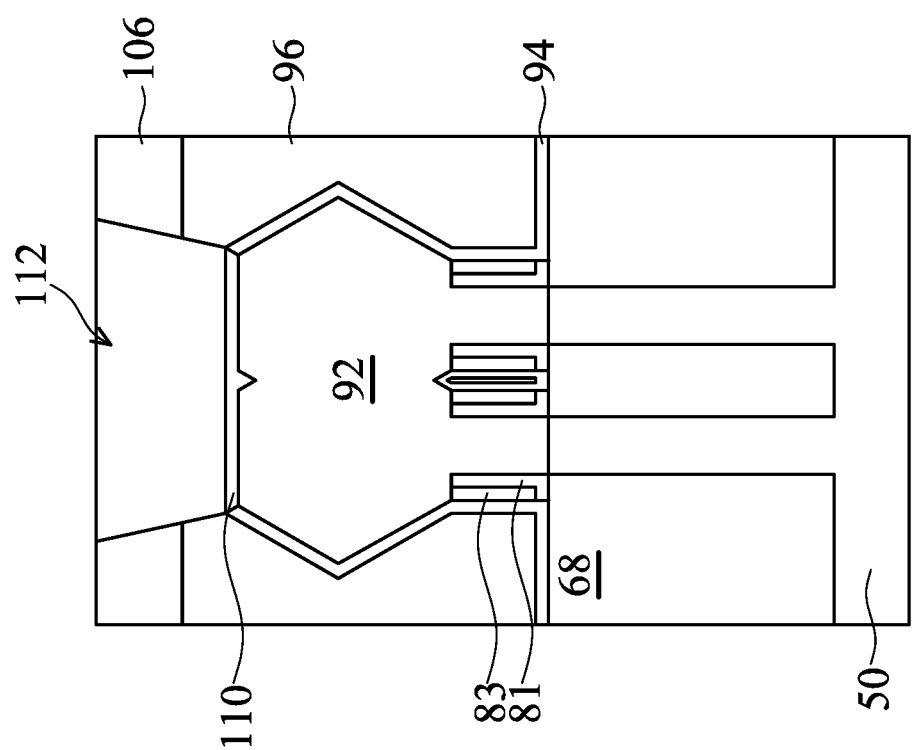

Next, in FIGS. 23A-23C, contacts 112 (may also be referred to as contact plugs) are formed in the third recesses 108. The contacts 112 may comprise one or more layers, such as barrier layers, diffusion layers, and fill materials. For example, in some embodiments, the contacts 112 include a barrier layer and a conductive material, and are electrically coupled to the underlying conductive feature (e.g., gate structure 102 and/or silicide region 110 in the illustrated embodiment). The contacts 112 that are electrically coupled to the gate structure 102 may be referred to as gate contacts, and the contacts 112 that are electrically coupled to the silicide regions 110 may be referred to as source/drain contacts. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 106.

Embodiments may achieve advantages. For example, embodiments such as those discussed above may improve the dishing profile of the inner spacers of nano-FETs and may narrow the seams of the inner spacers. The seam reduction may be achieved by an anneal treatment, such as a furnace thermal process with a wet steam anneal and a dry $N_2$ anneal. The anneal treatment may favorably reduce dielectric constant k of the inner spacer material and may form a hydrophobic surface by encouraging Si—O—Si bonding. This may be helpful to retain thickness of the inner spacers by increasing wet etching resistance during a subsequent etch process. Preventing electrical shorts on the seams and reducing weak points for subsequent etching achieved by the reduction of the seams may be useful for device integration, which may increase the AC performance of the nano-FET device by reducing the effective gate capacitance ($C_{eff}$) of the device.

In accordance with an embodiment, a semiconductor device includes: a semiconductor substrate; a channel region over the semiconductor substrate, the channel region including a first semiconductor layer; a gate stack over the channel region, the gate stack including a gate electrode and a gate dielectric; a first epitaxial source/drain region adjacent the channel region; and a first inner spacer between the first semiconductor layer and the first epitaxial source/drain region, the first inner spacer including SiOCN, the first inner spacer having an oxidized layer to a depth in a range of 1 nm to 5 nm, the oxidized layer having a gradient of atomic percentage of oxygen from 30% to 60% measured from a sidewall of the first inner spacer contacting the epitaxial source/drain region into the first inner spacer. In an embodiment, the channel region further includes a multi-layer stack of semiconductor layers and wherein portions of the gate electrode are between semiconductor layers of the multi-layer stack. In an embodiment, the first inner spacer has dishing to a distance of less than 3.2 nm. In an embodiment, the first inner spacer has a second sidewall contacting the gate dielectric, and a maximum horizontal distance measured between the second sidewall and a vertical line through top and bottom vertices of the second sidewall is in a range of 1 nm to 2 nm. In an embodiment, the first inner spacer has dishing to a distance in a range of less than 0.5 nm. In an embodiment, the first inner spacer has a density in a range of 2.5 $g/cm^3$ to 2.9 $g/cm^3$. In an embodiment, the first inner spacer comprises a gradient of atomic percentage of carbon from 7% to 9% measured from the first sidewall of the first inner spacer contacting the epitaxial source/drain region into the first inner spacer. In an embodiment, the first inner spacer comprises a gradient of atomic percentage of nitrogen from 25% to 20% measured from the first sidewall of the first inner spacer contacting the epitaxial source/drain region into the first inner spacer. In an embodiment, the first inner spacer comprises a gradient of atomic percentage of silicon from 35% to 45% measured from the first sidewall of the first inner spacer contacting the epitaxial source/drain region into the first inner spacer.

In accordance with another embodiment, a method includes: forming a multi-layer stack on a semiconductor substrate, the multi-layer stack including alternating first layers and second layers, the first layers being a first semiconductor material, the second layers being a second semiconductor material; forming a first recess through the multi-layer stack; laterally recessing sidewalls of the second layers of the multi-layer stack, the sidewalls being adjacent to the first recess; forming an inner spacer layer over the multi-layer stack, the inner spacer layer having seams; performing an anneal treatment on the inner spacer layer, the anneal treatment including a wet anneal and a dry anneal, the anneal treatment closing the seams of the inner spacer layer; removing an outer portion of the inner spacer layer to form inner spacers adjacent to the recessed second layers of the multi-layer stack; and removing the second layers of the multi-layer stack. In an embodiment, the seams of the inner spacer layer close while the wet anneal is performed. In an embodiment, the wet anneal converts Si—NH—Si bonds in the inner spacer layer to Si—OH—Si bonds. In an embodiment, the dry anneal converts the Si—OH—Si bonds in the inner spacer layer to Si—O—Si bonds.

In accordance with yet another embodiment, a method of forming a semiconductor device includes: depositing alternating layers of a first semiconductor material and a second semiconductor material on a semiconductor substrate; forming a first dummy gate and a second dummy gate on the alternating layers, the first dummy gate being in a first channel region, the second dummy gate being in a second channel region; etching a first recess through the alternating layers using the first dummy gate and the second dummy gate as masks; removing outer portions of the alternating layers of the first semiconductor material, the removing the outer portions forming a plurality of second recesses; depositing an inner spacer layer over the alternating layers of the first semiconductor material and the second semiconductor material; performing a steam anneal on the inner spacer layer; performing a dry anneal on the inner spacer layer; etching the inner spacer layer to form respective inner spacers in the plurality of second recesses; and removing the alternating layers of the first semiconductor material. In an embodiment, depositing the inner spacer layer comprises forming a SiOCN film using $H_2SiCl_2$, $C_3H_6$, $O_2$, and $NH_3$ as precursors. In an embodiment, the steam anneal is an $H_2O$ anneal performed in a furnace at a temperature in a range of 200° C. to 600° C. In an embodiment, the dry anneal is an $N_2$ anneal performed in a furnace at a temperature in a range of 600° C. to 700° C. In an embodiment, the inner spacer layer expands by 10% after the performing the steam anneal. In an embodiment, the inner spacer layer includes a contact angle in a range of 25° to 30° before performing the steam anneal. In an embodiment, the inner spacer layer includes a contact angle in a range of 33° to 40° after performing the steam anneal. In an embodiment, the etching the inner spacer layer includes a wet etch process including HF, $H_2O_2$, $H_2O$, $HClNH_3$, or $H_2SO_4$.

In accordance with yet another embodiment, a semiconductor device includes: a first semiconductor layer over a substrate; a gate structure surrounding the first semiconductor layer; a source/drain region adjacent the first semiconductor layer; and an inner spacer between the gate structure and the source/drain region, the inner spacer having an atomic percentage of oxygen varying from 35% to 30% measured from a sidewall of the inner spacer contacting the source/drain region deeper into the inner spacer. In an embodiment, the inner spacer has a k-value in a range of 4.4 to 5.3. In an embodiment, the inner spacer has dishing to a distance less than 0.5 nm. In an embodiment, the gate structure has a length in a range of 13 nm to 16 nm. In an embodiment, the semiconductor device further includes a spacer on a sidewall of the gate structure, the spacer being over the inner spacer. In an embodiment, the spacer has a k-value in a range of 4.1 to 5.5. In an embodiment, the inner spacer includes SiOCN. In an embodiment, the SiOCN has a density in a range of 2.5 $g/cm^3$ to 2.9 $g/cm^3$.

In accordance with yet another embodiment, a semiconductor device includes: a nanostructure over a substrate; a source/drain region adjacent the nanostructure; a gate electrode surrounding the nanostructure in a cross-sectional view; and an inner spacer under the nanostructure, the inner spacer between the source/drain region and the gate electrode, the inner spacer including SiOCN, the inner spacer including a gradient of atomic percentage of oxygen from 35% to 30% measured from a surface of the inner spacer contacting the source/drain region into the inner spacer. In an embodiment, the inner spacer has dishing to a distance less than 3.2 nm. In an embodiment, the inner spacer has a density in a range of 2.5 $g/cm^3$ to 2.9 $g/cm^3$. In an embodiment, the inner spacer includes a gradient of atomic percentage of carbon from 7% to 9% measured from the surface of the inner spacer contacting the source/drain region into the inner spacer. In an embodiment, the inner spacer includes a gradient of atomic percentage of nitrogen from 20% to 25% measured from the surface of the inner spacer contacting the source/drain region into the inner spacer. In an embodiment, the inner spacer includes a gradient of atomic percentage of silicon from 35% to 45% measured from the surface of the inner spacer contacting the source/drain region into the inner spacer.

In accordance with yet another embodiment, a semiconductor device includes: a first nanostructure over a substrate; a second nanostructure over the first nanostructure; a gate electrode around the first nanostructure and the second nanostructure; a gate dielectric layer between the gate electrode and the first nanostructure and between the gate electrode and the second nanostructure; a source/drain region adjacent the first nanostructure and the second nanostructure; and a first inner spacer between the gate electrode and the source/drain region, the first inner spacer being below the first nanostructure, the first inner spacer having a gradient of atomic percentage of oxygen from 30% to 60% measured from a first sidewall of the first inner spacer contacting the source/drain region into the first inner spacer. In an embodiment, the first inner spacer has a k-value in a range of 4.5 to 5.1. In an embodiment, the semiconductor device further includes a second inner spacer between the gate electrode and the source/drain region, the second inner spacer being above the first nanostructure and below the second nanostructure. In an embodiment, the second inner spacer has dishing to a distance less than 0.5 nm. In an embodiment, the second inner spacer has a second sidewall contacting the gate dielectric layer, and wherein a maximum horizontal distance measured between the second sidewall and a vertical line through top and bottom vertices of the second sidewall is in a range of 1 nm to 2 nm. In an embodiment, the semiconductor device further includes a gate spacer along an upper sidewall of the gate dielectric layer, the gate spacer being above the second nanostructure, wherein the gate spacer has a k-value in a range of 4.1 to 5.5.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a multi-layer stack on a semiconductor substrate, the multi-layer stack comprise alternating first layers and second layers;
   recessing sidewalls of the first layers of the multi-layer stack to form first recesses;
   forming an inner spacer layer, first portions of the inner spacer layer extending into the first recesses;
   performing an anneal treatment on the inner spacer layer, the anneal treatment comprising a wet anneal and a dry anneal; and
   removing second portions of the inner spacer layer to form inner spacers in the first recesses.

2. The method of claim 1, wherein the first portions of the inner spacer layer have seams before the anneal treatment.

3. The method of claim 2, wherein the seams are closed after the anneal treatment.

4. The method of claim 1, wherein the wet anneal reduces amine groups in the inner spacer layer.

5. The method of claim 1, wherein the dry anneal reduces hydroxyl groups in the inner spacer layer.

6. The method of claim 1, wherein the anneal treatment turns a surface of the inner spacer layer from hydrophilic to hydrophobic.

7. The method of claim 1, wherein the wet anneal is performed before the dry anneal during the anneal treatment.

8. A method of forming a semiconductor device, the method comprising:
- forming layers of a first semiconductor material and a second semiconductor material on a semiconductor substrate stacked in an alternating pattern, the first semiconductor material being different from the second semiconductor material;
- removing outer portions of the layers of the first semiconductor material to form first recesses;
- depositing an inner spacer layer on sidewalls of the layers of the first semiconductor material and the second semiconductor material;
- performing an anneal treatment on the inner spacer layer, wherein the anneal treatment comprises a steam anneal followed by a dry anneal;
- etching the inner spacer layer to form inner spacers in the first recesses; and
- removing the layers of the first semiconductor material.

9. The method of claim 8, wherein the steam anneal is performed at a temperature in a range from 200° C. to 600° C. in presence of water.

10. The method of claim 8, wherein the dry anneal is performed at a temperature in a range from 600° C. to 700° C. in presence of nitrogen.

11. The method of claim 8, wherein a thickness of the inner spacer layer increases by 10% after the performing the steam anneal.

12. The method of claim 8, wherein a surface of the inner spacer layer is hydrophobic after the anneal treatment.

13. The method of claim 8, wherein the anneal treatment closes seams in the inner spacer layer.

14. A method comprising:
- forming a multi-layer stack on a semiconductor substrate, wherein the multi-layer stack comprises first layers of a first semiconductor material and second layers of a second semiconductor material stacked in an alternating pattern, wherein the second semiconductor material is different from the first semiconductor material;
- removing a portion of a first layer of the first layers to form a first recess;
- forming an inner spacer layer on sidewalls of the first layers and the second layers, wherein a first portion of the inner spacer layer extends into the first recess, and wherein an outer surface of the first portion of the inner spacer layer forms a seam in the first recess;
- performing an anneal treatment on the inner spacer layer, wherein opposing surfaces of the seam are joined by bonds after the anneal treatment; and
- removing second portions of the inner spacer layer to form inner spacers in the first recesses.

15. The method of claim 14, wherein the anneal treatment comprises a wet anneal followed by a dry anneal, and wherein the dry anneal uses a higher temperature than the wet anneal.

16. The method of claim 15, wherein the wet anneal decreases a k-value of the inner spacer layer.

17. The method of claim 15, wherein the dry anneal decreases a hydrophilicity of a surface of the inner spacer layer.

18. The method of claim 14, wherein a thickness of the inner spacer layer increases by 10% after the anneal treatment.

19. The method of claim 14, wherein forming the inner spacer layer comprises forming a SiOCN film.

20. The method of claim 14, wherein a sidewall of the first layer is concave after forming the first recess.

\* \* \* \* \*